United States Patent
Lu

(10) Patent No.: US 11,139,247 B2
(45) Date of Patent: Oct. 5, 2021

(54) INTERCONNECTION STRUCTURE, SEMICONDUCTOR PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/354,155

(22) Filed: Mar. 14, 2019

(65) Prior Publication Data

US 2020/0294929 A1    Sep. 17, 2020

(51) Int. Cl.
| | |
|---|---|
| H01L 23/48 | (2006.01) |
| H01L 23/532 | (2006.01) |
| H01L 23/522 | (2006.01) |
| H01L 23/528 | (2006.01) |
| H01L 25/10 | (2006.01) |
| H01L 23/00 | (2006.01) |

(52) U.S. Cl.
CPC .... *H01L 23/53295* (2013.01); *H01L 23/5226* (2013.01); *H01L 23/5283* (2013.01); *H01L 24/17* (2013.01); *H01L 25/105* (2013.01); H01L 2224/0401 (2013.01); H01L 2225/1058 (2013.01); H01L 2924/35121 (2013.01); H01L 2924/381 (2013.01)

(58) Field of Classification Search
CPC .......... H01L 23/5226; H01L 23/53295; H01L 2224/0401; H01L 2225/1058
USPC .................................................. 257/701, 690
See application file for complete search history.

(56) References Cited

U.S. PATENT DOCUMENTS

| | | | | |
|---|---|---|---|---|
| 5,241,456 | A * | 8/1993 | Marcinkiewicz ... | H01L 23/5384 174/250 |
| 5,703,400 | A * | 12/1997 | Wojnarowski ...... | H01L 25/0652 257/723 |
| 6,075,712 | A * | 6/2000 | McMahon ............ | H01L 23/481 174/255 |
| 9,418,965 | B1 | 8/2016 | Li et al. | |
| 2003/0141105 | A1* | 7/2003 | Sugaya ................. | H01L 21/56 174/256 |
| 2006/0125072 | A1* | 6/2006 | Mihara ................. | H01L 24/19 257/686 |
| 2009/0243065 | A1* | 10/2009 | Sugino ................ | H01L 25/0657 257/686 |
| 2010/0059899 | A1* | 3/2010 | Sakurai ............ | G06K 19/07745 257/787 |
| 2012/0319295 | A1* | 12/2012 | Chi ......................... | H01L 25/03 257/774 |
| 2013/0171774 | A1* | 7/2013 | Chen ..................... | H01L 25/105 438/121 |

(Continued)

*Primary Examiner* — Nitin Parekh
(74) *Attorney, Agent, or Firm* — Foley & Lardner LLP

(57) ABSTRACT

An interconnection structure includes a first dielectric layer and a second dielectric layer. The second dielectric layer is disposed on the first dielectric layer. The second dielectric layer has a first surface and a second surface, both facing toward the first dielectric layer. The first surface of the second dielectric layer is recessed from the second surface of the second dielectric layer and defines a recess. A portion of the first dielectric layer is disposed within the recess.

17 Claims, 58 Drawing Sheets

(56) References Cited

U.S. PATENT DOCUMENTS

| | | | |
|---|---|---|---|
| 2013/0249101 A1* | 9/2013 | Lin | H01L 23/5389 |
| | | | 257/773 |
| 2015/0364394 A1* | 12/2015 | Lin | H01L 21/568 |
| | | | 257/734 |
| 2016/0343694 A1* | 11/2016 | Lin | H01L 21/78 |
| 2019/0088564 A1* | 3/2019 | Tai | H01L 21/6835 |
| 2019/0252311 A1* | 8/2019 | Kuroyanagi | H01L 23/528 |

\* cited by examiner

INTERCONNECTION STRUCTURE, SEMICONDUCTOR PACKAGE AND METHOD OF MANUFACTURING THE SAME

BACKGROUND

1. Technical Field

The present disclosure relates generally to an interconnection structure, and more particularly, to an interconnection structure including more than one dielectric layer and a method of manufacturing the same.

2. Description of the Related Art

An interconnection structure such as an interposer/substrate can be used for electrical connection/layout between different electrical components, such as between a semiconductor die and a main board. The different electrical components may have different input/output (I/O) terminal densities, e.g., a semiconductor die may have a higher I/O terminal density than a main board. An interconnection structure with a high-density circuitry (such as a redistribution layer) may be included, which may have a greater size or thickness and may cause defects such as solder short, warpage/distortion, and cracks/delamination.

SUMMARY

In one aspect, according to some embodiments, an interconnection structure includes a first dielectric layer and a second dielectric layer. The second dielectric layer is disposed on the first dielectric layer. The second dielectric layer has a first surface and a second surface, both facing toward the first dielectric layer. The first surface of the second dielectric layer is recessed from the second surface of the second dielectric layer and defines a recess. A portion of the first dielectric layer is disposed within the recess.

In another aspect, according to some embodiments, a semiconductor package includes a first interconnection layer and a second interconnection layer. The first interconnection layer has a first conductive layer and a first dielectric layer at least partially covering the first conductive layer. The second interconnection layer has a second conductive layer and a second dielectric layer at least partially covering the second conductive layer. The first interconnection layer is at least partially surrounded by the second interconnection layer. A material of the first dielectric layer is different from a material of the second dielectric layer.

In yet another aspect, according to some embodiments, a method of manufacturing an interconnection structure includes providing a carrier, forming a patterned seed layer on the carrier, forming a patterned metal layer on the patterned seed layer, forming a first dielectric layer on the carrier to surround the patterned seed layer and the patterned metal layer, removing the carrier, removing the seed layer to form a recess defined by a surface of the patterned metal layer and a surface of the first dielectric layer, and forming a second dielectric layer in the recess and on the surface of the first dielectric layer.

BRIEF DESCRIPTION OF THE DRAWINGS

Aspects of the present disclosure are best understood from the following detailed description when read with the accompanying drawings. It is noted that various features may not be drawn to scale, and, in the drawings, the dimensions of the depicted features may be arbitrarily increased or reduced for clarity of discussion.

Common reference numerals are used throughout the drawings and the detailed description to indicate the same or similar elements. The present disclosure will be more readily understood from the following detailed description taken in conjunction with the accompanying drawings.

DETAILED DESCRIPTION

Some embodiments of the present disclosure disclose an interconnection structure including two interconnection layers, each having a conductive layer and a dielectric layer. The two conductive layers may have different pitches or densities. An interface between the dielectric layers of the two interconnection layers may have surfaces that are non-coplanar or discontinuous. The dielectric layers of the two interconnection layers may have different materials with different coefficient of thermal expansions (CTE) or different modulus. By the implementation of the present disclosure, cracks or delamination between the two interconnection layers due to thermal stress or warpage may be prevented or reduced.

Figure 1A:
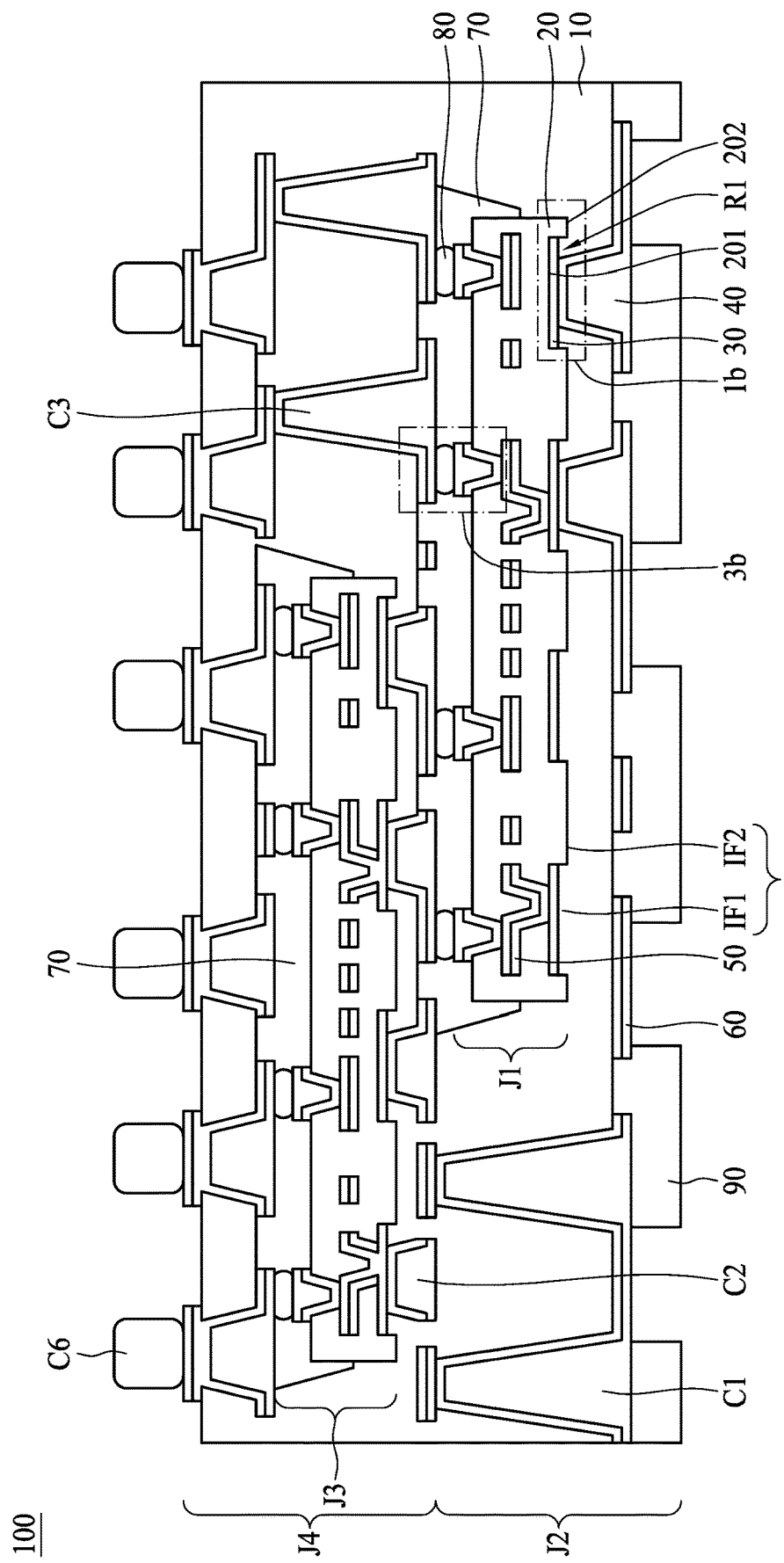
FIG. 1A illustrates a cross-sectional view of a semiconductor package in accordance with some embodiments of the present disclosure.
Figure 1B:
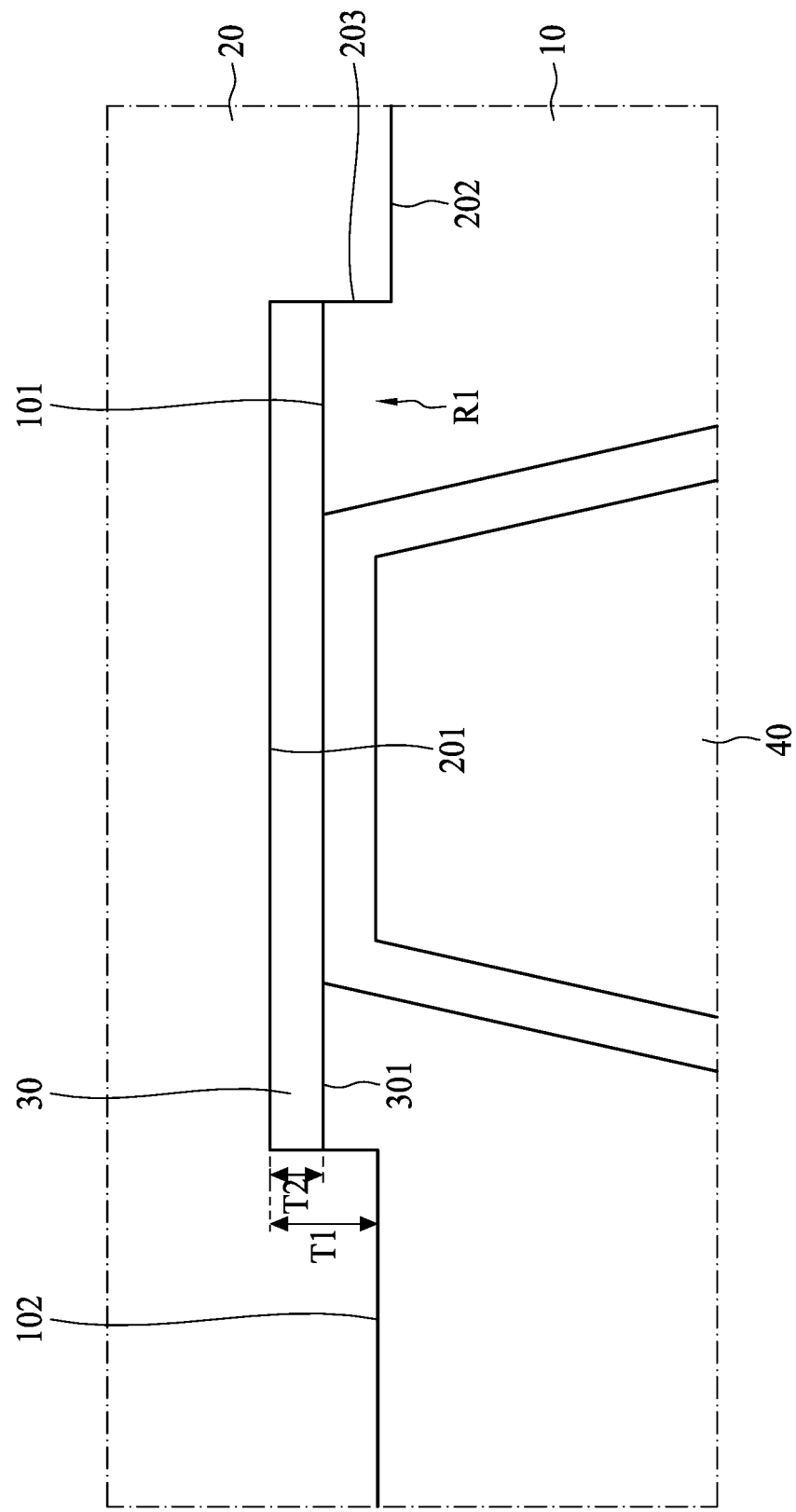
FIG. 1B illustrates an enlarged view of a portion of a semiconductor package in accordance with some embodiments of the present disclosure.

FIG. 1A illustrates a cross-sectional view of a semiconductor package 100 in accordance with some embodiments of the present disclosure. The semiconductor package 100 may include, be, or be part of an interconnection structure. FIG. 1B illustrates an enlarged view of a portion 1b of the semiconductor package 100 in FIG. 1A.

The semiconductor package 100 includes interconnection layers J1, J2, J3 and J4. The interconnection layer J1 is at least partially surrounded by the interconnection layer J2. The interconnection layer J3 is at least partially surrounded by the interconnection layer J4. The interconnection layers J1 and J3 may have the same or similar features. The interconnection layers J2 and J4 may have the same or similar features and may be electrically connected by conductors C1, C2 and C3, which may be conductive pillars or vias.

Referring to FIG. 1A and FIG. 1B, the interconnection layer J1 includes a conductive layer 50, a dielectric layer 20, a metal layer 30 and connection elements 80. The interconnection layer J2 includes a conductive layer 60, a dielectric layer 10, a conductive via 40, an underfill 70 and a patterned insulation layer 90.

A pitch of the conductive layer 50 may be less than a pitch of the conductive layer 60. In some embodiments, the pitch of the conductive layer 50 is equal to or less than 7 μm. A density of the conductive layer 50 may be greater than a density of the conductive layer 60. The conductive layers 50 and 60 may include, for example, aluminum (Al), copper (Cu), chromium (Cr), tin (Sn), gold (Au), silver (Ag), nickel (Ni) or stainless steel, or a mixture, an alloy, or other combination thereof.

The dielectric layer 20 covers the conductive layer 50. In some embodiments, the dielectric layer 20 may partially cover the conductive layer 50 and partially expose the conductive layer 50. The dielectric layer 20 is partially covered or surrounded by the underfill 70. The dielectric layer 10 at least partially covers the conductive layer 60.

In some embodiments, a material of the dielectric layer 10 of the interconnection layer J2 is different from a material of the dielectric layer 20 of the interconnection layer J1. For example, a coefficient of thermal expansion (CTE) of the dielectric layer 10 may be greater than a CTE of the dielectric layer 20. A modulus of the dielectric layer 10 may be greater than a modulus of the dielectric layer 20. In some embodiments, the dielectric layer 10 includes polypropylene (PP). In some embodiments, the dielectric layer 20 includes polyamide (PA).

As shown in FIG. 1B, the dielectric layer 20 is disposed on the dielectric layer 10. The dielectric layer 20 includes a surface 201 and a surface 202, both facing toward the dielectric layer 10. The surface 201 is recessed from the surface 202 and defines a recess R1. The surface 201 and the surface 202 are discontinuous and are connected by a surface 203 of the dielectric layer 20.

The dielectric layer 10 includes a surface 101 and a surface 102. The surface 101 faces toward the surface 201 of the dielectric layer 20 and the surface 102 faces toward the surface 202 of the dielectric layer 20. The surface 101 protrudes from or beyond the surface 102. A portion of the dielectric layer 10 is disposed within the recess R1.

As shown in FIG. 1A and FIG. 1B, the metal layer 30 of the interconnection layer J1 is disposed on and in contact with the surface 201 of the dielectric layer 20. The metal layer 30 is disposed within the recess R1, that is, the metal layer 30 is recessed from the surface 202 of the dielectric layer 20. The metal layer 30 may be entirely accommodated in the recess R1, and a surface 301 of the metal layer 30 is non-coplanar with the surface 202 of the dielectric layer 20. The surface 301 of the metal layer 30 is in contact with the surface 101 of the dielectric layer 10. As shown in FIG. 1B, a distance T1 between the surface 102 of the dielectric layer 10 and the surface 201 of the dielectric layer 20 is greater than a thickness T2 of the metal layer 30. The metal layer 30 may include, for example, Al, Cu, Cr, Sn, Au, Ag, Ni or stainless steel, or a mixture, an alloy, or other combination thereof.

As shown in FIG. 1A and FIG. 1B, the conductive via 40 connects the conductive layer 60 of the interconnection layer J2 and the metal layer 30 of the interconnection layer J1. A portion of the conductive via 40 is disposed within or protrudes into the recess R1, and is in contact with the metal layer 30. The conductive via 40 is surrounded or encapsulated by the dielectric layer 10. The conductive via 40 may have a tapered shape, and a thickness/width/diameter of a portion of the conductive via 40 away from the metal layer 30 may be greater than a thickness/width/diameter of a portion of the conductive via 40 adjacent to the metal layer 30.

As shown in FIG. 1A, an interface IF between the interconnection layer J1 and the interconnection layer J2 includes a surface IF1 and a surface IF2. The surface IF1 is defined between the metal layer 30 of the interconnection layer J1 and the dielectric layer 10 of the interconnection layer J2. The surface IF2 is defined between the dielectric layer 20 of the interconnection layer J1 and the dielectric layer 10 of the interconnection layer J2. The surface IF1 and the surface IF2 are discontinuous and non-coplanar with respect to each other. In the embodiment shown in FIG. 1A, the surface IF1 and the surface IF2 are parallel to each other.

In some embodiments, different materials between the interconnection layer J1 and the interconnection layer J2 may cause stress (e.g., a lateral stress) accumulated in the vicinity of the interface IF between them during various manufacturing processes which may include various temperature cycles. The discontinuity or noncoplanarity of the interface IF or the material configuration (e.g., CTE or modulus) of the dielectric layers 10 and 20 may prevent the stress from extending through the interface IF, thus preventing a crack or delamination between the interconnection layers J1 and J2.

The connection elements 80 of the interconnection layer J1 are surrounded by the underfill 70 of the interconnection layer J2 and are electrically connected to conductors of the interconnection layer J4. The connection elements 80 may include solder balls.

The patterned insulation layer 90 of the interconnection layer J2 is disposed on the conductive layer 60 and exposes portions of the conductive layer 60. The patterned insulation layer 90 may include a solder resist material. The exposed portions of the conductive layer 60 may be used for external electrical connection.

As shown in FIG. 1A, the semiconductor package 100 further comprises connection elements C6 which may be part of the interconnection layer J4. The connection elements C6 may include solder and may have a square, circle, rectangle, leveling or a camber shape. The connection elements C6 may be used to electrically connect another electrical device.

The underfill 70 of the interconnection layer J2 or the interconnection layer J4 may include or be a capillary underfill (CUF) or a molded underfill (MUF). In some embodiments, the underfill 70 may be or may include an anisotropic conductive film (ACF) or an anisotropic conductive paste (ACP) which includes conductive particles therein. In some embodiments, the conductive particles within the ACF or ACP may replace the connection elements 80 for electrical connection between different interconnection layers.

Figure 2:
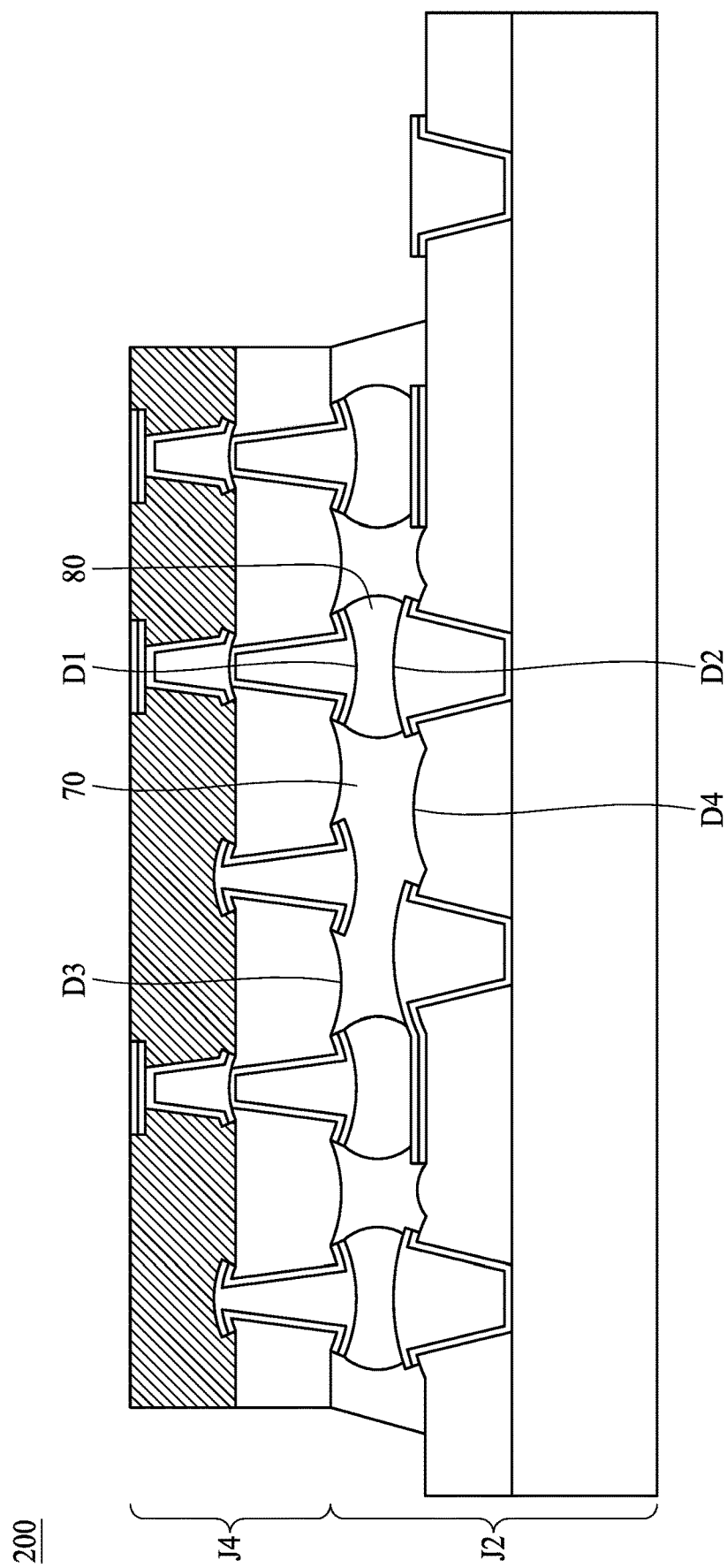
FIG. 2 illustrates a cross-sectional view of a portion of a semiconductor package in accordance with some embodiments of the present disclosure.

FIG. 2 illustrates a cross-sectional view of a portion 200 of a semiconductor package in accordance with some embodiments of the present disclosure.

As shown in FIG. 2, an interconnection layer J2 and an interconnection layer J4 are connected through connection elements 80, which are connected to conductive vias of the interconnection layer J2 and the interconnection layer J4 and are surrounded by an underfill 70 disposed between the interconnection layer J2 and the interconnection layer J4. A surface of a conductive via of the interconnection layer J4 defines a dimple or a protrusion D1. A surface of a conductive via of the interconnection layer J2 defines a dimple or a protrusion D2. A surface of a dielectric layer of the interconnection layer J4 defines a dimple or a protrusion D3. A surface of a dielectric layer of the interconnection layer J2 defines a dimple or a protrusion D4.

The dimples D1, D2, D3 and D4 may result from shrinkage involved in manufacturing operations such as a curing operation. A size or height of the dimple D1 or D3 may be proportional to a density of conductive vias within the interconnection layer J4. A size or height of the dimple D2 or D4 may be proportional to a density of conductive vias within the interconnection layer J2.

Figure 3:
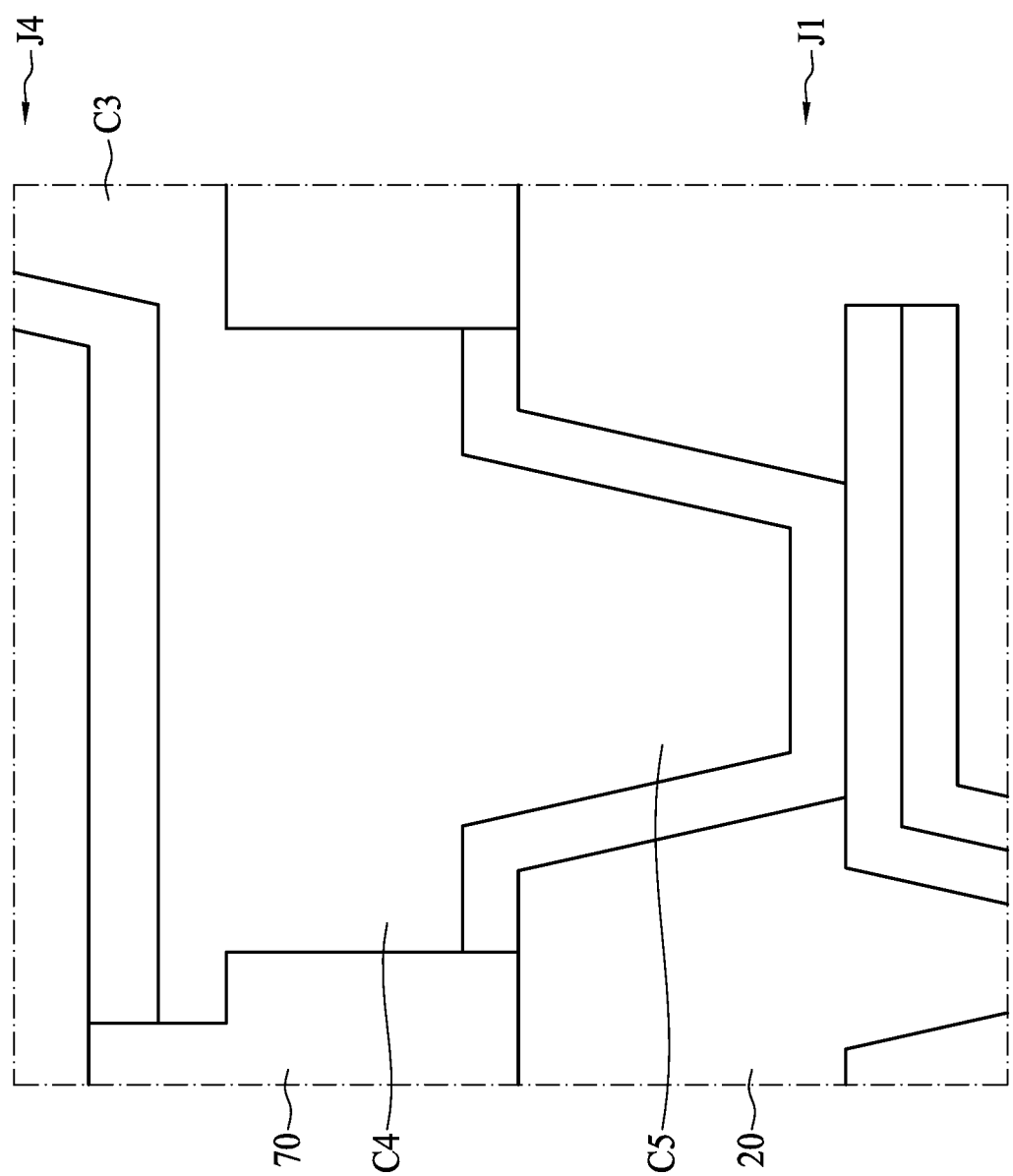
FIG. 3 illustrates a cross-sectional view of a portion of a semiconductor package in accordance with some embodiments of the present disclosure.

In the embodiment shown in FIG. 1A, the connection elements 80 are utilized for connection between the interconnection layer J1 and the interconnection layer J4. In some embodiments, the connection elements 80 may be omitted. For example, referring to FIG. 1A and FIG. 3, a portion 3b of the semiconductor package 100 in FIG. 1A may be replaced by the structure illustrated in FIG. 3, wherein a conductive C4 is implemented to connect a conductor C5 of the interconnection layer J1 and the conductor C3 of the interconnection layer J4, which may result from a direct metal to metal bonding.

Figure 4:
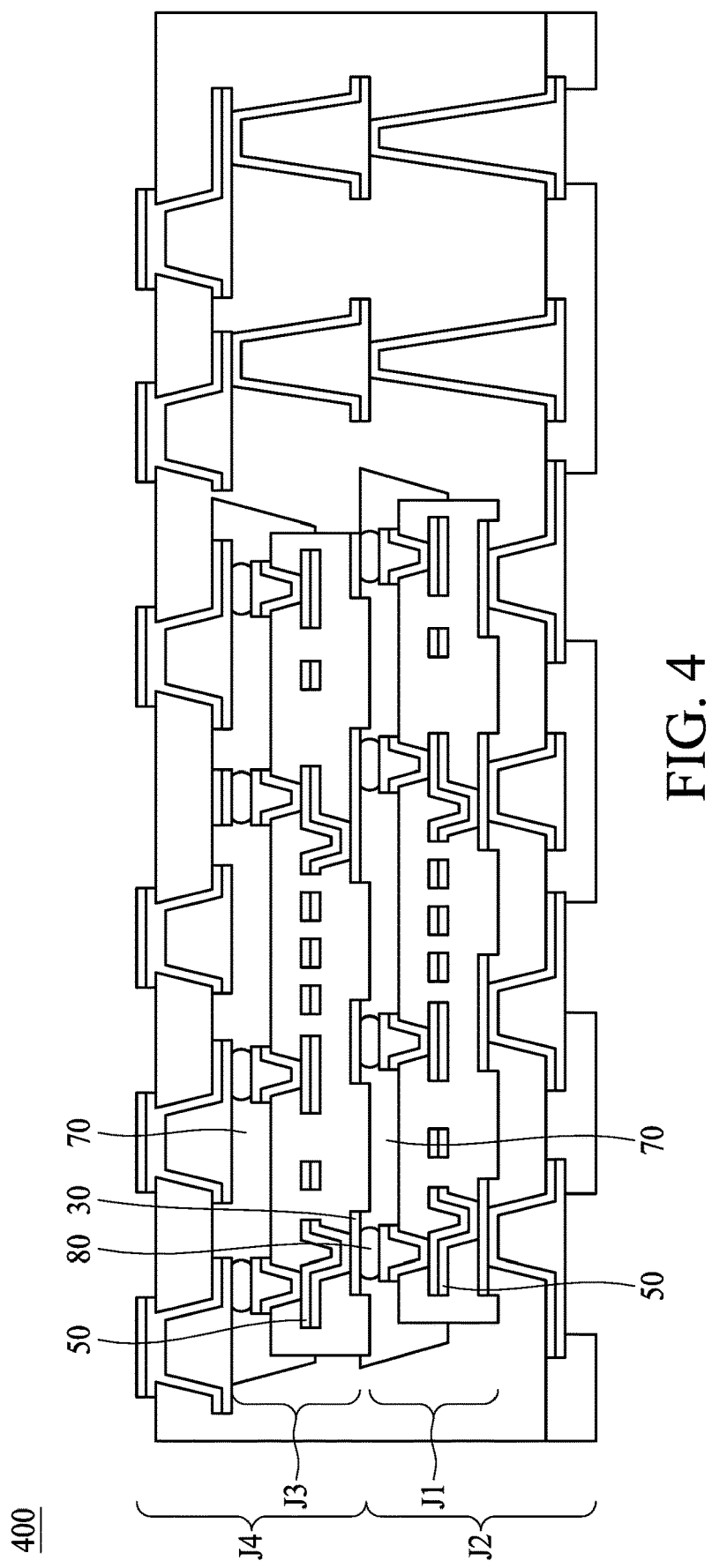
FIG. 4 illustrates a cross-sectional view of a semiconductor package in accordance with some embodiments of the present disclosure.

FIG. 4 illustrates a cross-sectional view of a semiconductor package 400 in accordance with some embodiments of the present disclosure. The semiconductor package 400 is similar to the semiconductor package 100 in FIG. 1A with some differences described below.

The interconnection layer J1 and the interconnection layer J3 are directly connected. As shown in FIG. 4, a conductive layer 50 of the interconnection layer J1 is electrically connected to a conductive layer 50 of the interconnection layer J3 through connection elements 80. That is, there may not be another conductive layer with a relatively low-density or large-pitch between the conductive layer 50 of the interconnection layer J1 and the conductive layer 50 of the interconnection layer J3 that have a relatively high-density or small-pitch.

Figure 5:
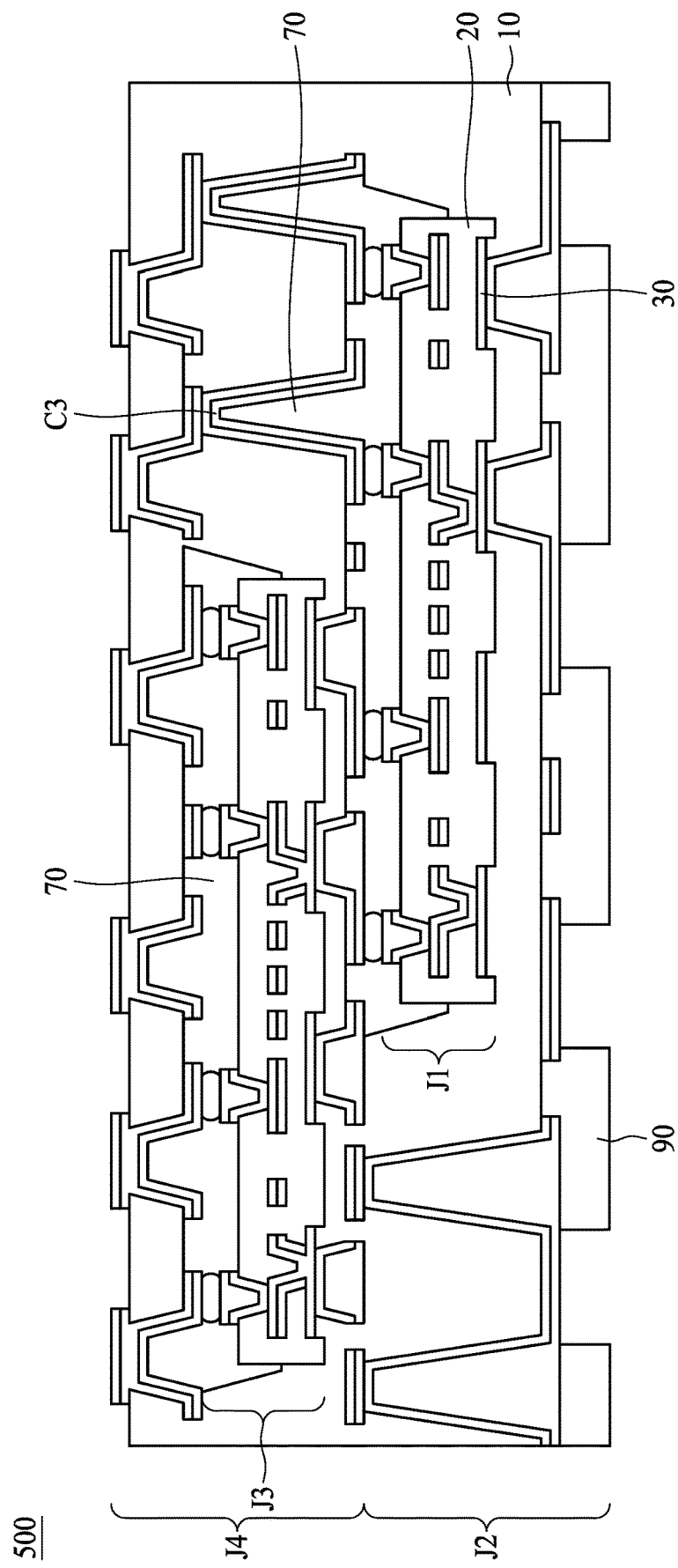
FIG. 5 illustrates a cross-sectional view of a semiconductor package in accordance with some embodiments of the present disclosure.

FIG. 5 illustrates a cross-sectional view of a semiconductor package 500 in accordance with some embodiments of the present disclosure. The semiconductor package 500 is similar to the semiconductor package 100 in FIG. 1A except that a portion of the conductor C3 of the interconnection layer J4 is hollow such that a portion of the underfill 70 of the interconnection layer J2 is disposed therein. That is, a portion of the underfill 70 is surrounded by the conductor C3, which may enhance the structural strength of the semiconductor package 500.

Figure 6:
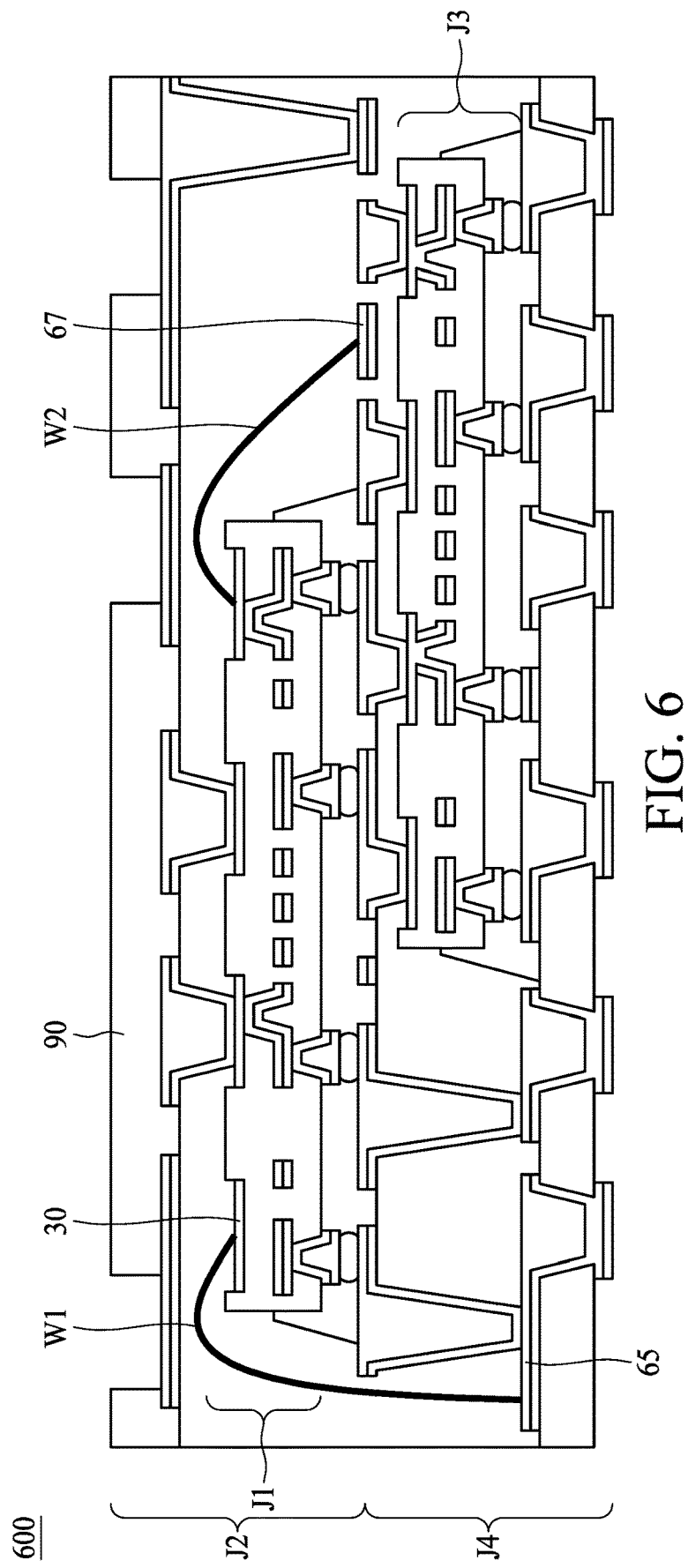
FIG. 6 illustrates a cross-sectional view of a semiconductor package in accordance with some embodiments of the present disclosure.

FIG. 6 illustrates a cross-sectional view of a semiconductor package 600 in accordance with some embodiments of the present disclosure. The semiconductor package 600 is similar to the semiconductor package 100 in FIG. 1A except that conductive wires are implemented to electrically connect different interconnection layers. For example, a conductive wire W1 electrically connects the metal layer 30 of the interconnection layer J1 to a conductive layer 65 of the interconnection layer J4, and a conductive wire W2 electrically connects the metal layer 30 of the interconnection layer J1 to a conductive layer 67 of the interconnection layer J4. The conductive wires W1 and W2 may include Cu, Au, Solder, Ag, Ni, Al or an alloy thereof.

Figure 7:
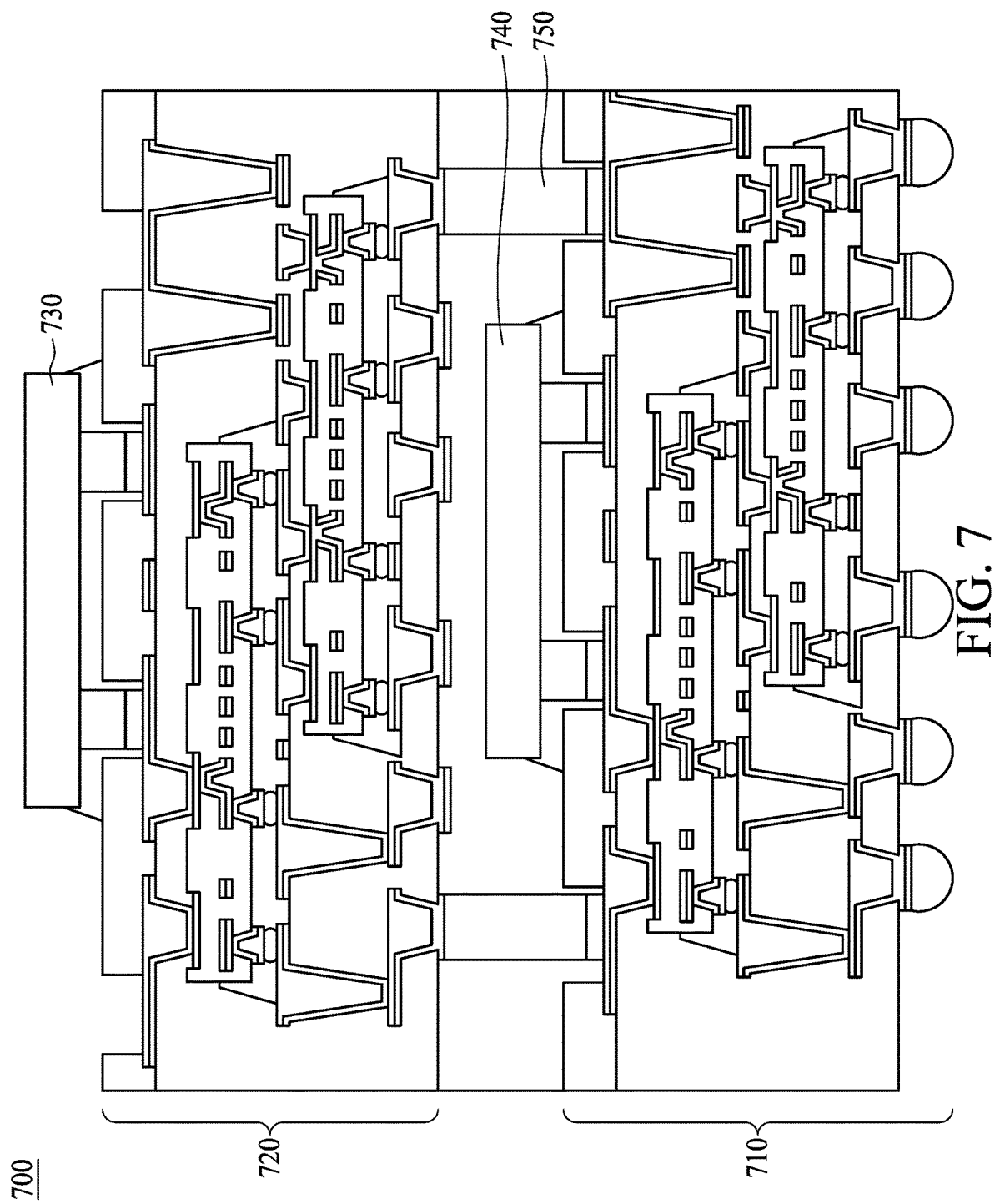
FIG. 7 illustrates a cross-sectional view of a semiconductor device package in accordance with some embodiments of the present disclosure.

FIG. 7 illustrates a cross-sectional view of a semiconductor device package 700 in accordance with some embodiments of the present disclosure. The semiconductor device package 700 includes semiconductor packages 710 and 720, electronic components 730 and 740, and conductors 750.

The semiconductor packages 710 and 720 are the same as or similar to the semiconductor package 100 in FIG. 1A. The semiconductor package 720 is disposed on the semiconductor package 710 and is electrically connected to the semiconductor package 710 by conductors 750, which may include a conductive pillar or bump. The electronic components 730 and 740 are disposed or bonded on the semiconductor packages 720 and 710, respectively, wherein a flip chip bonding, wire bonding, or die attach film (DAF) bonding may be involved.

Figure 8B:
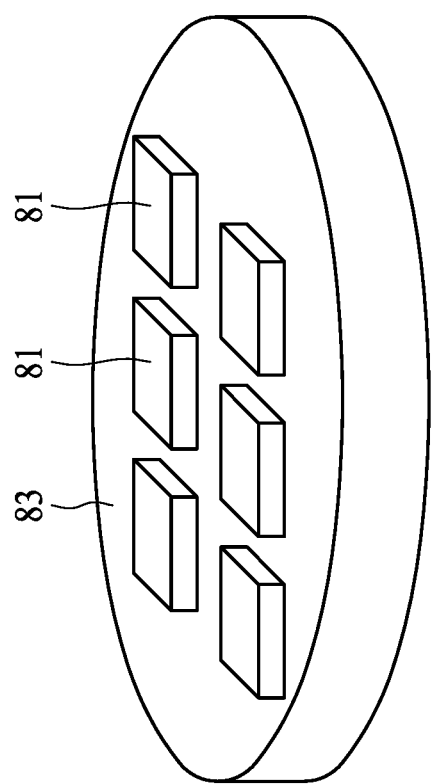
FIGS. 8A and 8B illustrate various types of semiconductor device packages in accordance with some embodiments of the subject application.
Figure 8A:
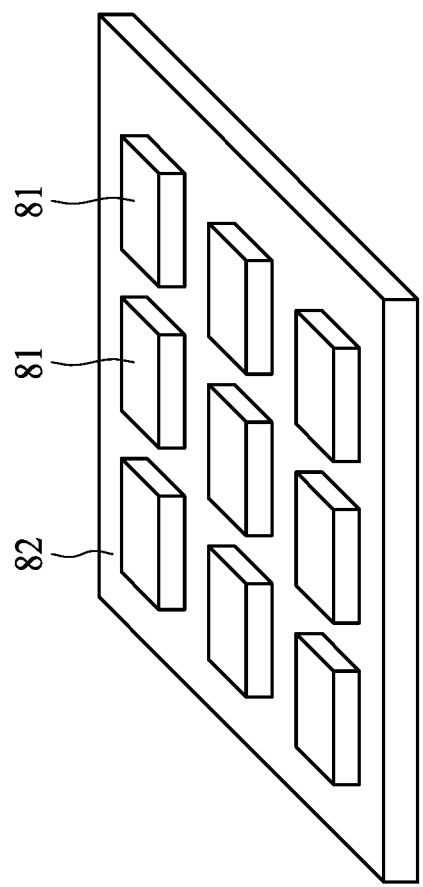

FIGS. 8A and 8B illustrate various types of semiconductor device packages in accordance with some embodiments of the subject application. The semiconductor device packages may be bonded with each other or may be bonded with an external device.

As shown in FIG. 8A, a plurality of chips, dies or semiconductor device packages 81 are placed on a square-shaped carrier 82. In some embodiments, the carrier 82 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof), or a combination of two or more thereof.

As shown in FIG. 8B, a plurality of chips, dies or semiconductor device packages 81 are placed on a circle-shaped carrier 83. In some embodiments, the carrier 83 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof), or a combination of two or more thereof.

FIG. 9A, FIG. 9B, FIG. 9C, FIG. 9D, FIG. 9E, and FIG. 9F are cross-sectional views of a portion of a semiconductor package fabricated at various stages, in accordance with some embodiments of the present disclosure.

Figure 9A:
FIG. 9A, FIG. 9B, FIG. 9C, FIG. 9D, FIG. 9E, and FIG. 9F are cross-sectional views of a portion of a semiconductor package fabricated at various stages, in accordance with some embodiments of the present disclosure.
Figure 9B:
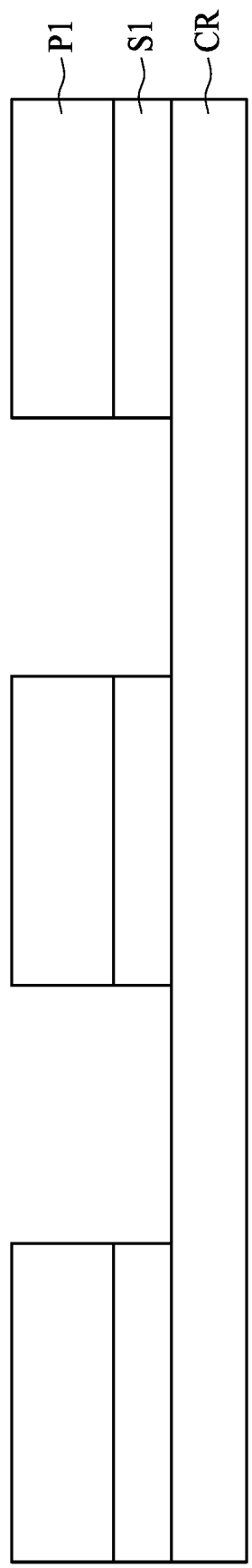

Referring to FIG. 9A, a carrier CR is provided. The carrier CR may include glass or epoxy. A seed layer S1 is formed on the carrier CR. The seed layer S1 may include metallic material and may be formed by a plating operation. Referring to FIG. 9B, a photoresist (PR) layer P1 is formed on the seed layer S1, wherein a coating operation may be performed. A portion of the PR layer P1 and a portion of the seed layer S1 are removed such that the seed layer S1 is patterned, wherein a developing operation and an etching operation may be involved.

Figure 9C:
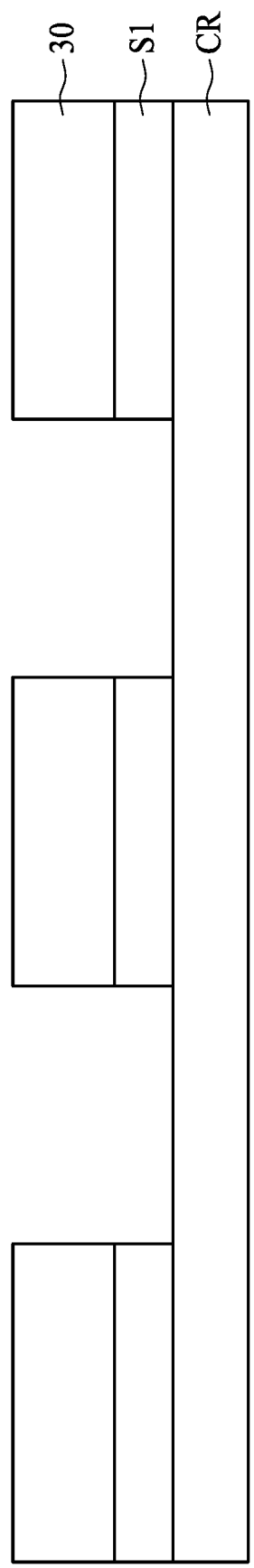
Figure 9D:
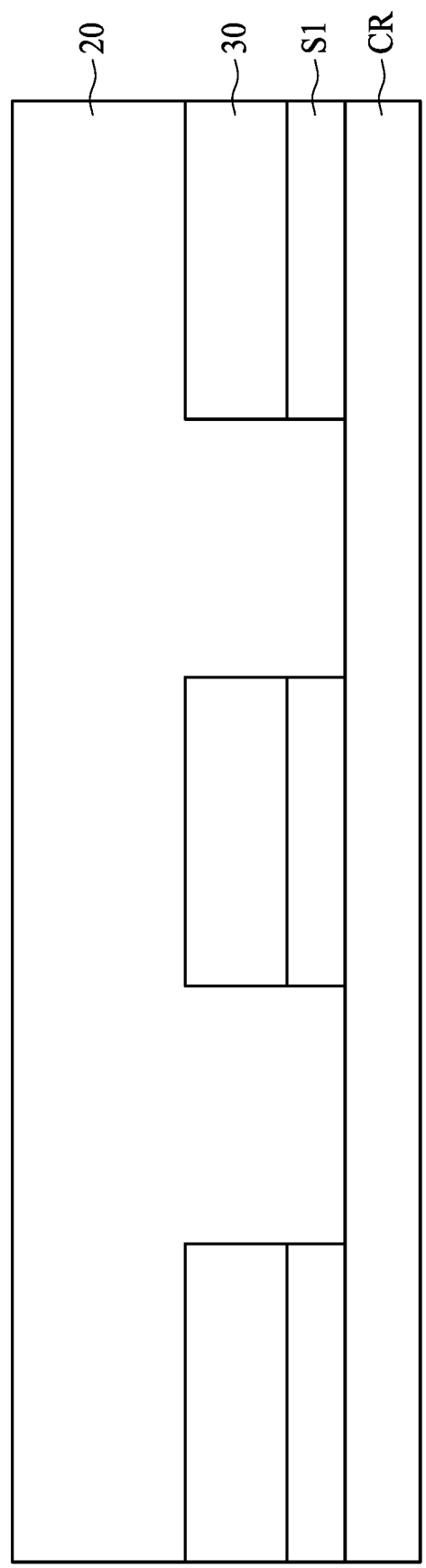

Referring to FIG. 9C, the PR layer P1 is removed. A metal layer (or patterned metal layer) 30 is formed on the seed layer S1, wherein a plating operation may be performed. Referring to FIG. 9D, a dielectric layer 20 is formed on the carrier CR to cover or surround the seed layer S1 and the metal layer 30. In some embodiments, the dielectric layer 20 may include polyamide (PA).

Figure 9E:
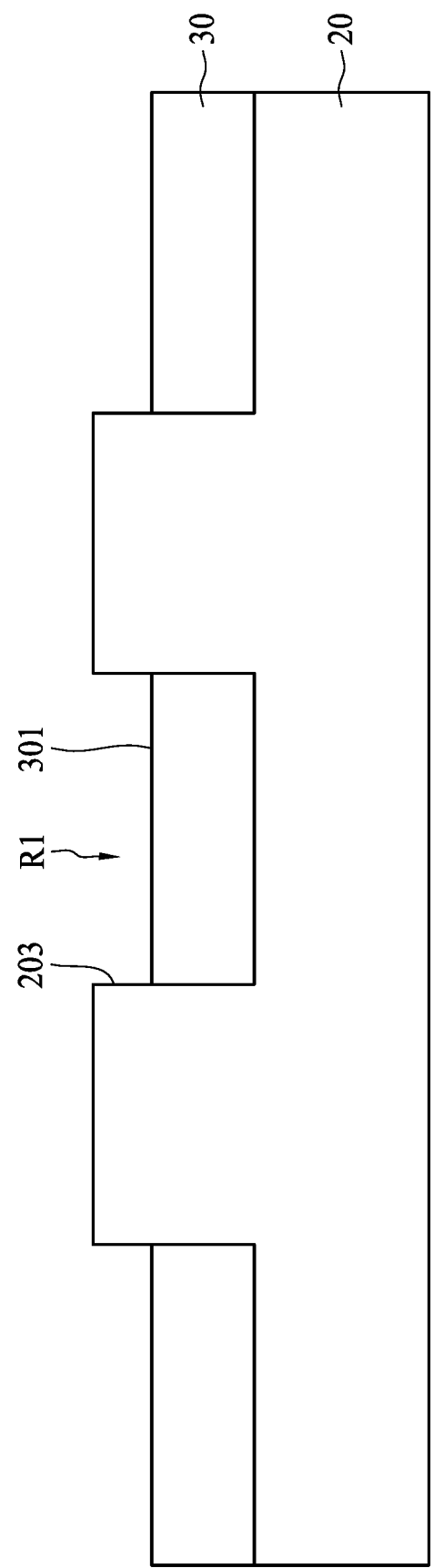

Referring to FIG. 9E, the carrier CR is removed. The seed layer S1 is removed, wherein an etching operation may be performed. A recess R1 defined by a surface 203 of the dielectric layer 20 and a surface 301 of the metal layer 30 is formed.

Figure 9F:
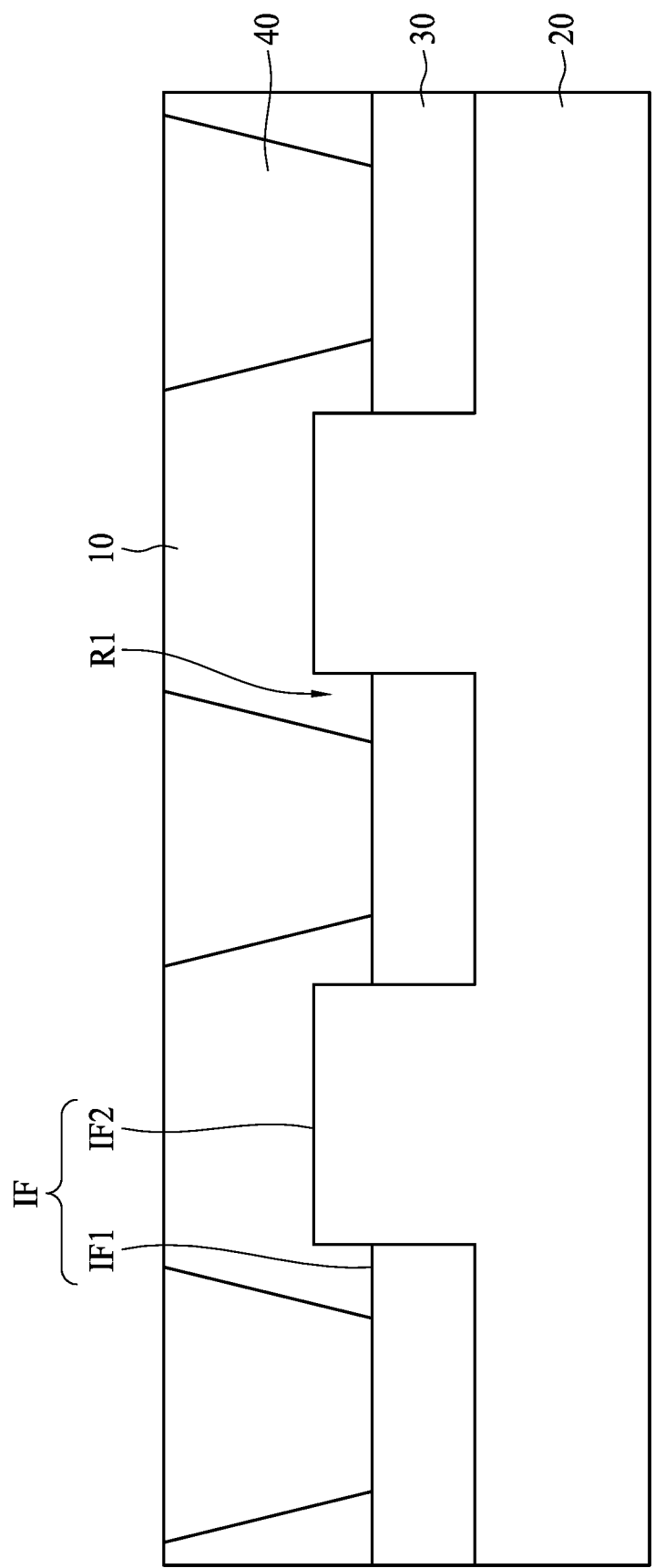

Referring to FIG. 9F, a dielectric layer 10 is formed on the dielectric layer 20 and the metal layer 30. A portion of the dielectric layer 10 is in the recess R1. A conductive via 40 is formed within the dielectric layer 10 and in contact with the metal layer 30. An interface IF including a surface IF1 and a surface IF2 is formed. The surface IF1 is defined between the metal layer 30 and the dielectric layer 10. The surface IF2 is defined between the dielectric layer 20 and the dielectric layer 10. The surface IF1 and the surface IF2 are discontinuous and non-coplanar with respect to each other. In some embodiments, a CTE of the dielectric layer 10 may be greater than a CTE of the dielectric layer 20. In some embodiments, a modulus of the dielectric layer 10 may be greater than a modulus of the dielectric layer 20.

FIG. 10A, FIG. 10B, FIG. 10C, FIG. 10D, FIG. 10E, FIG. 10F, FIG. 10G, FIG. 10H, FIG. 10I, FIG. 10J, FIG. 10K, FIG. 10L, FIG. 10M and FIG. 10N are cross-sectional views of an interconnection layer 10n fabricated at various stages, in accordance with some embodiments of the present disclosure.

Figure 10A:
FIG. 10A, FIG. 10B, FIG. 10C, FIG. 10D, FIG. 10E, FIG. 10F, FIG. 10G, FIG. 10H, FIG. 10I, FIG. 10J, FIG. 10K, FIG. 10L, FIG. 10M and FIG. 10N are cross-sectional views of in interconnection layer fabricated at various stages, in accordance with some embodiments of the present disclosure.
Figure 10B:
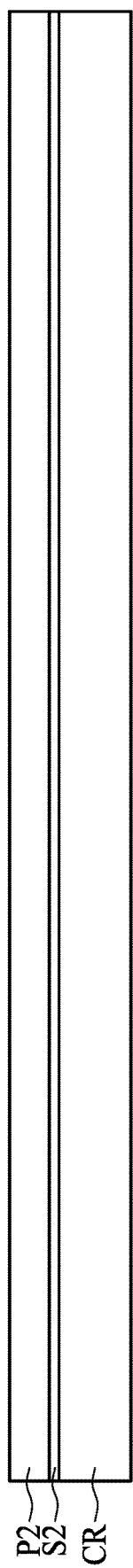

Referring to FIG. 10A, a carrier CR is provided. The carrier CR may include glass or epoxy. A seed layer S2 is formed on the carrier CR. The seed layer S1 may include metallic material and may be formed by a plating operation or a physical vaper deposition (PVD) operation. Referring to FIG. 10B, a PR layer P2 is formed on the seed layer S2, wherein a coating or lithographic operation may be performed. An exposure operation may be performed on the PR layer P2.

Figure 10C:
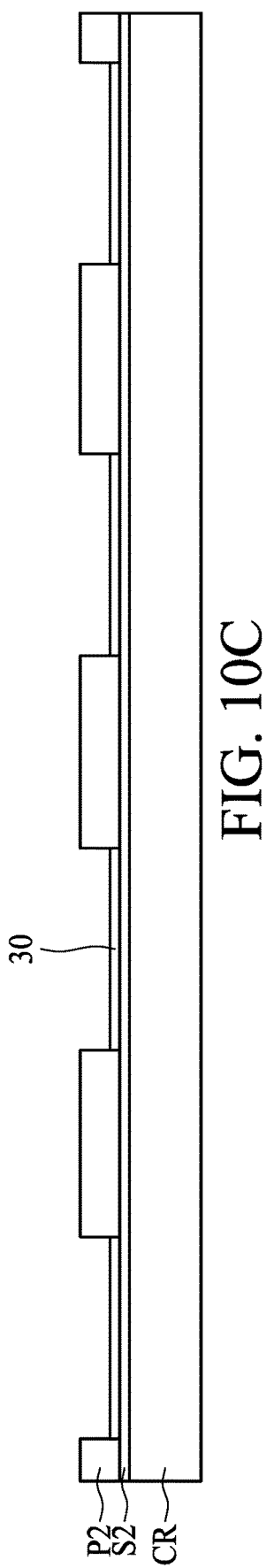
Figure 10D:
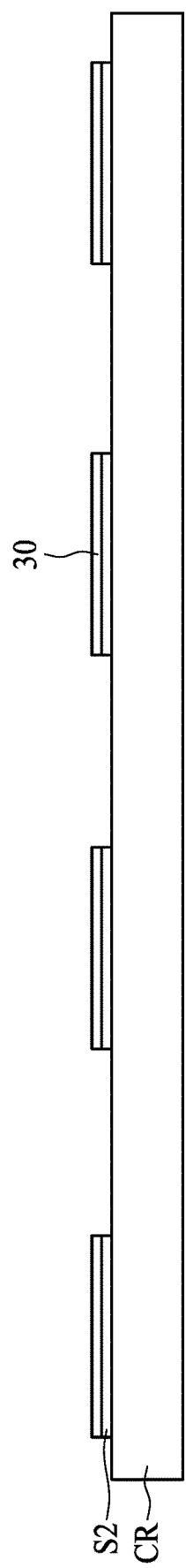

Referring to FIG. 10C, the PR layer P2 is developed. A portion of the PR layer P2 is removed, wherein an etching operation may be performed. A portion of the seed layer S2 is exposed. A metal layer 30 is disposed on the exposed seed layer S2, wherein a plating operation may be performed. Referring to FIG. 10D, the PR layer P2 and a portion of the seed layer S2 corresponding to the PR layer P2 are removed, wherein an etching operation may be performed.

Figure 10E:
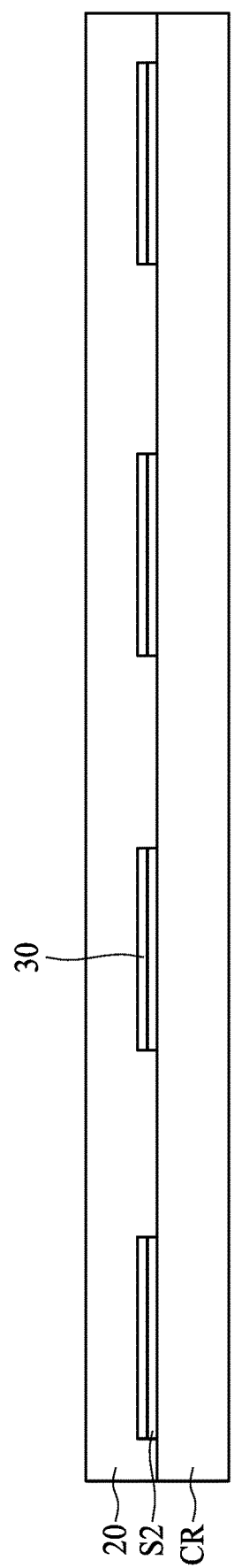
Figure 10F:
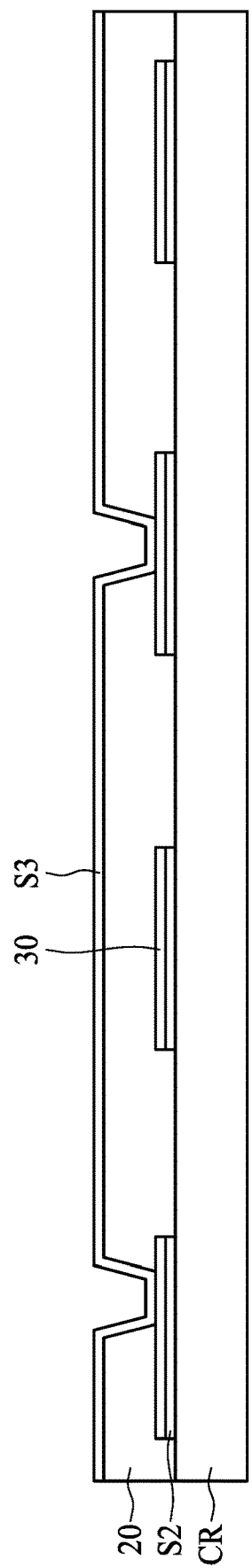

Referring to FIG. 10E, a dielectric layer (or a dielectric material) 20 is formed on the carrier CR and the metal layer 30, wherein a coating operation and a lithographic operation may be performed. An exposure operation may be performed. Referring to FIG. 10F, a portion of the dielectric layer 20 is removed to expose the metal layer 30, wherein a developing or etching operation may be performed. A seed layer S3 is formed conformally on the dielectric layer 20 and in contact with the metal layer 30.

Figure 10G:
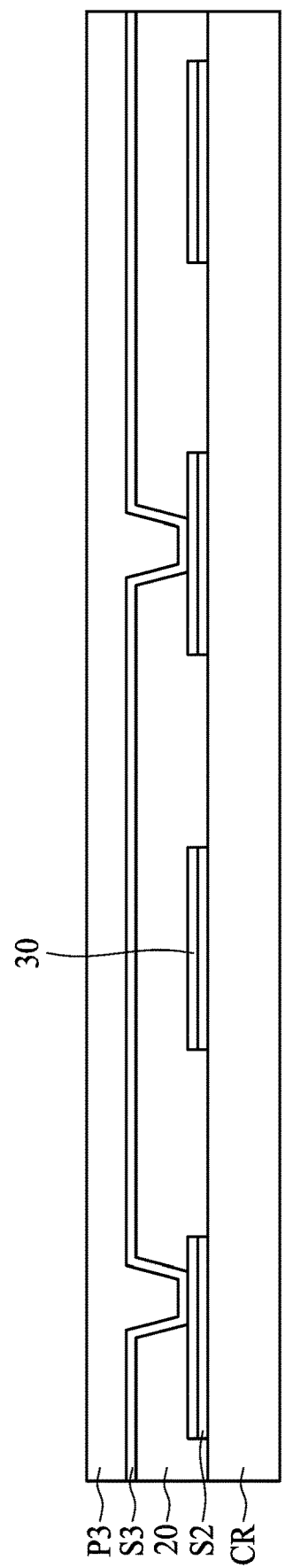
Figure 10H:
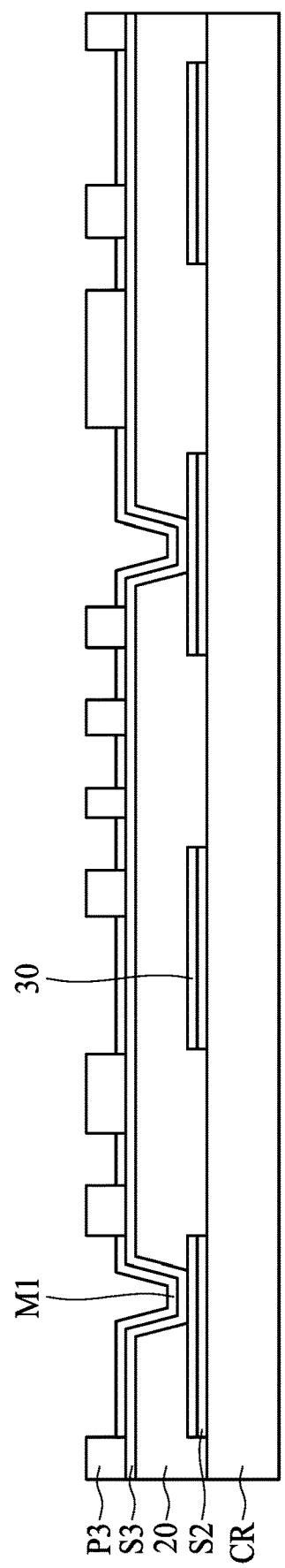

Referring to FIG. 10G, a PR layer P3 is formed on the seed layer S3, wherein a coating operation and a lithographic operation may be performed. An exposure operation may be performed. Referring to FIG. 10H, a portion of the PR layer P3 is removed to expose the seed layer S3, wherein an etching operation may be performed. A metal layer M1 is formed conformally on the seed layer S3, wherein a plating operation may be performed.

Figure 10I:
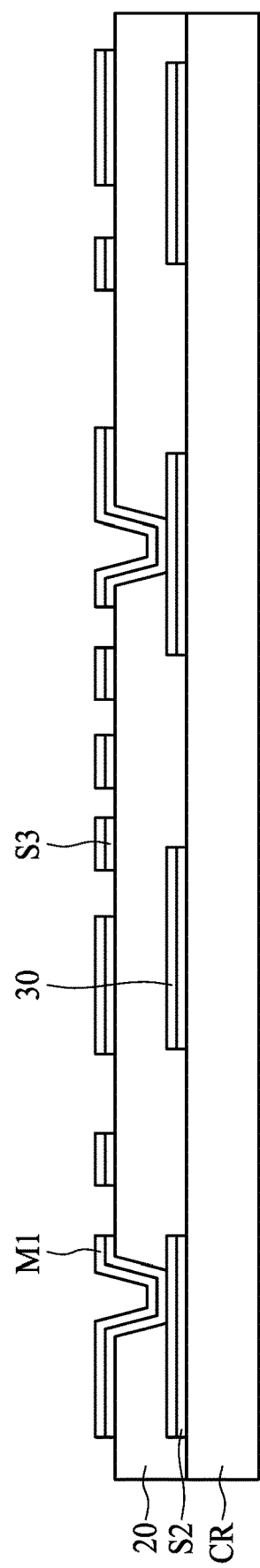
Figure 10J:
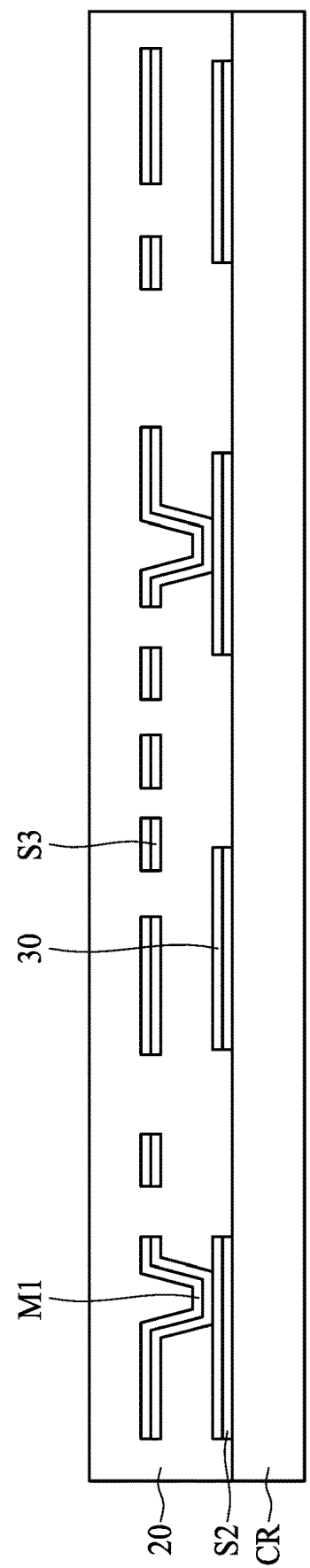

Referring to FIG. 10I, the PR layer P3 and a portion of the seed layer S3 corresponding to the PR layer P3 are removed, wherein an etching operation may be performed. Referring to FIG. 10J, a dielectric layer (or dielectric material) 20 is formed on the structure in FIG. 10I, wherein a coating and a lithographic operation may be performed. An exposure operation may be performed.

Figure 10K:
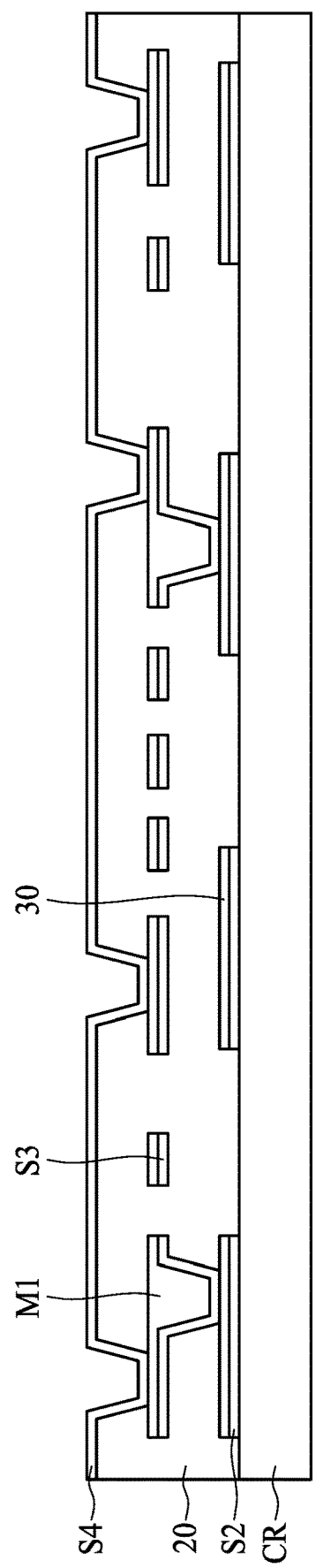
Figure 10L:
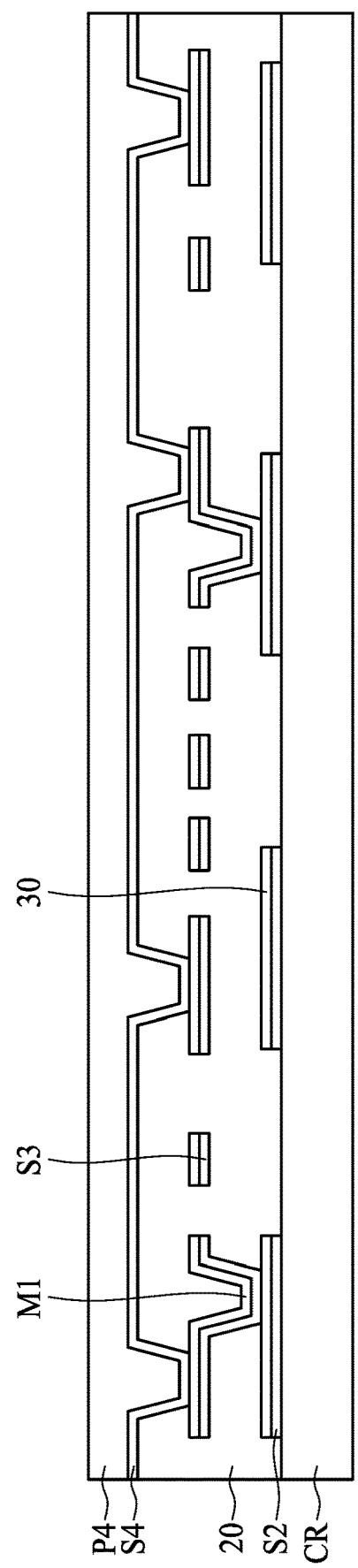

Referring to FIG. 10K, a portion of the dielectric layer 20 is removed to expose the metal layer M1, wherein a developing or etching operation may be performed. A seed layer S4 is formed conformally on the dielectric layer 20 and in contact with the metal layer M1. Referring to FIG. 10L, a PR layer P4 is formed on the seed layer S4, wherein a coating operation and a lithographic operation may be performed. An exposure operation may be performed.

Figure 10M:
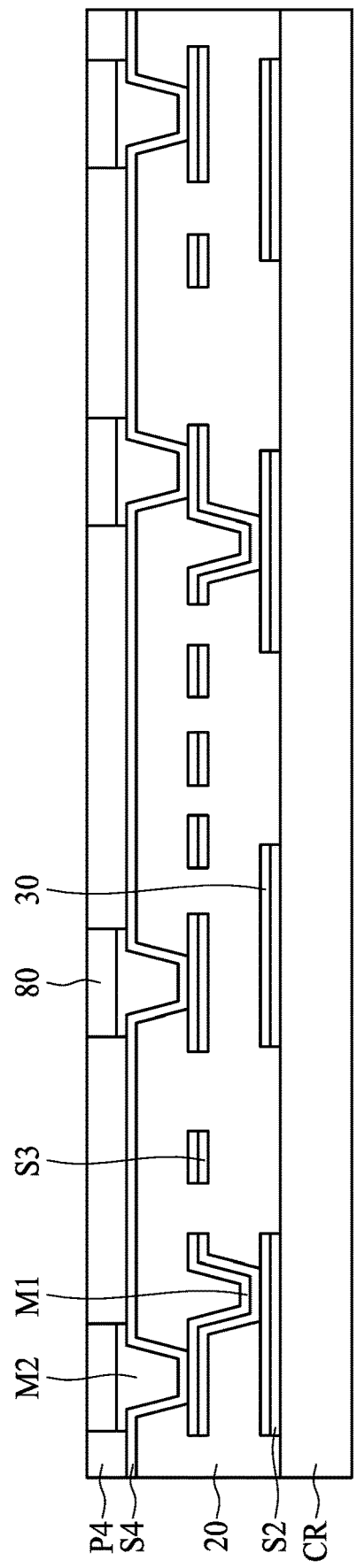
Figure 10N:
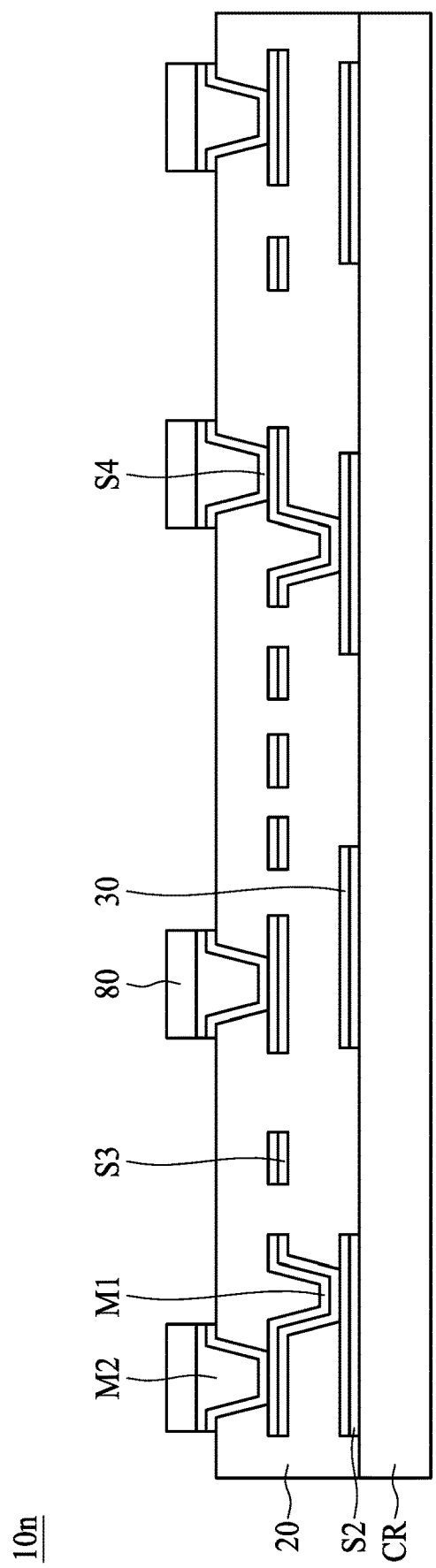

Referring to FIG. 10M, the PR layer P4 is developed. A portion of the PR layer P4 is removed to expose the seed layer S4. A metal layer M2 is disposed on the exposed seed layer S4, and a connection element 80 is disposed on the metal layer M2, wherein a plating or screening operation may be performed. The connection element 80 is surrounded by the PR layer P4. Referring to FIG. 10N, the PR layer P4 and a portion of the seed layer S4 corresponding to the PR layer P4 are removed to form the interconnection layer 10n, wherein an etching operation or a lithographic operation may be performed.

Figure 11A:
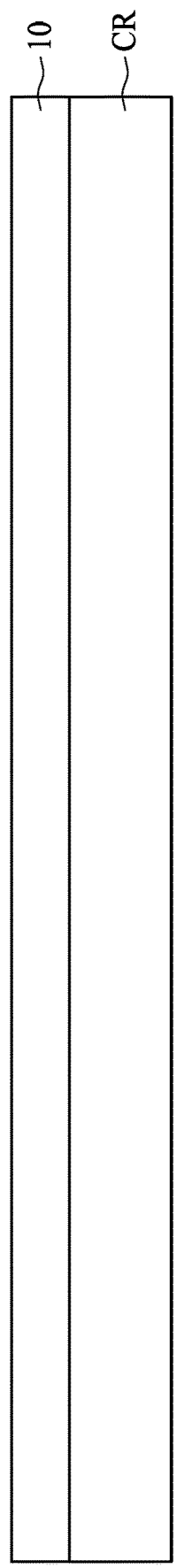
FIG. 11A, FIG. 11B, FIG. 11C, FIG. 11D, FIG. 11E, FIG. 11F, FIG. 11G, FIG. 11H, FIG. 11I, FIG. 11J, FIG. 11K, FIG. 11L, FIG. 11M, FIG. 11N, FIG. 11O, FIG. 11P, FIG. 11Q, FIG. 11R, FIG. 11S, FIG. 11T, FIG. 11U, FIG. 11V, FIG. 11W, FIG. 11X, FIG. 11Y, FIG. 11Z, FIG. 11AA, FIG. 11AB and FIG. 11AC are cross-sectional views of a semiconductor package at various stages, in accordance with some embodiments of the present disclosure.

FIG. 11A, FIG. 11B, FIG. 11C, FIG. 11D, FIG. 11E, FIG. 11F, FIG. 11G, FIG. 11H, FIG. 11I, FIG. 11J, FIG. 11K, FIG. 11L, FIG. 11M, FIG. 11N, FIG. 11O, FIG. 11P, FIG. 11Q, FIG. 11R, FIG. 11S, FIG. 11T, FIG. 11U, FIG. 11V, FIG. 11W, FIG. 11X, FIG. 11Y, FIG. 11Z, FIG. 11AA, FIG. 11AB and FIG. 11AC are cross-sectional views of a semiconductor package 11ac at various stages, in accordance with some embodiments of the present disclosure.

Figure 11B:
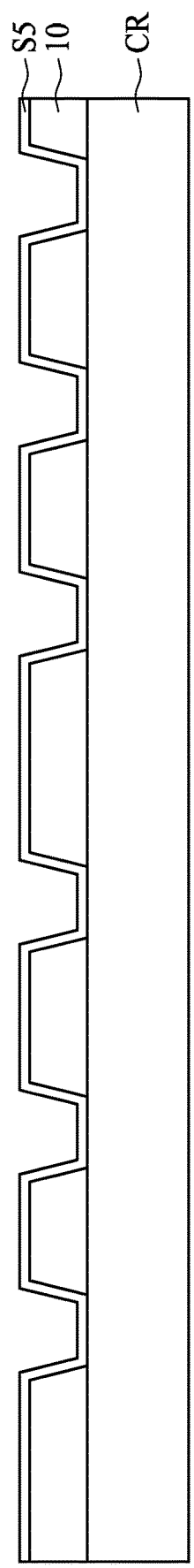

Referring to FIG. 11A, a carrier CR is provided. The carrier CR may be a wafer or panel. A dielectric layer (or dielectric material) 10 is disposed on the carrier CR, wherein a lamination, screening or coating operation may be performed. Referring to FIG. 11B, a portion of the dielectric layer 10 is removed to expose the carrier CR, wherein a laser drilling or etching operation may be performed. A seed layer S5 is disposed conformally on the dielectric layer 10.

Figure 11C:
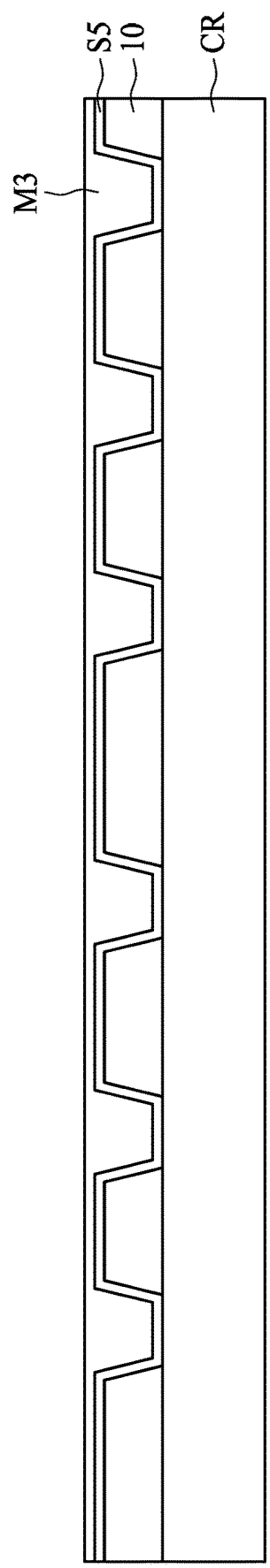
Figure 11D:
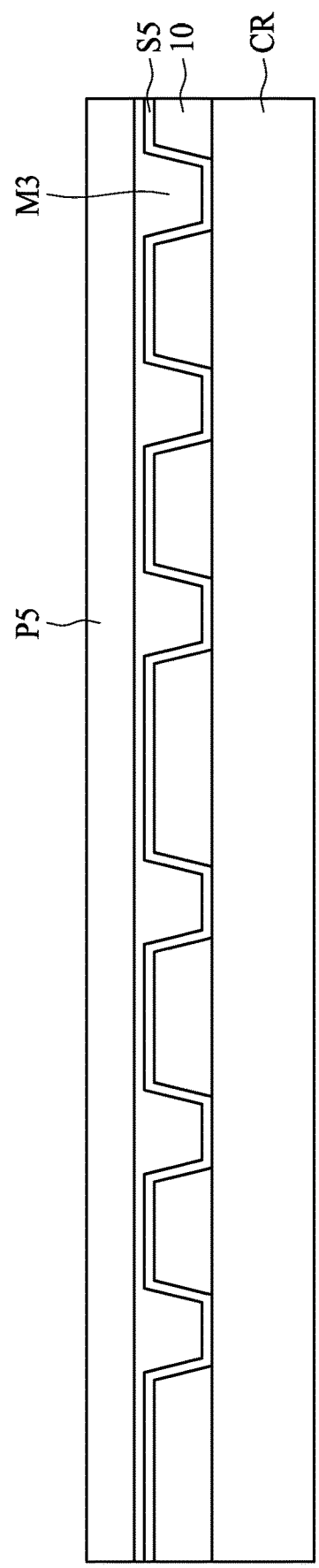

Referring to FIG. 11C, a metal layer M3 is disposed on the seed layer S5, wherein a plating (e.g., full plating) operation may be performed. Referring to FIG. 11D, a PR layer P5 is formed on the metal layer M3, wherein a coating or a lithographic operation may be performed. An exposure operation may be performed.

Figure 11E:
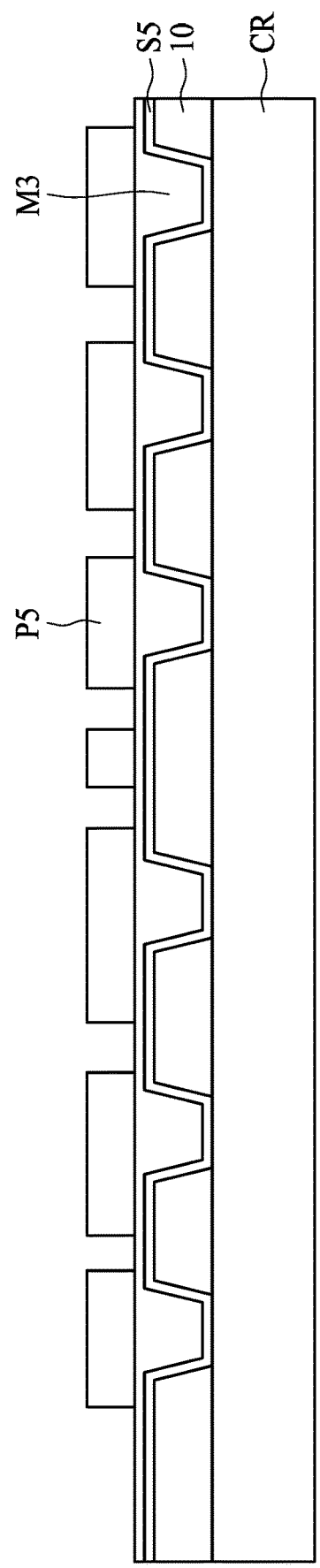
Figure 11F:
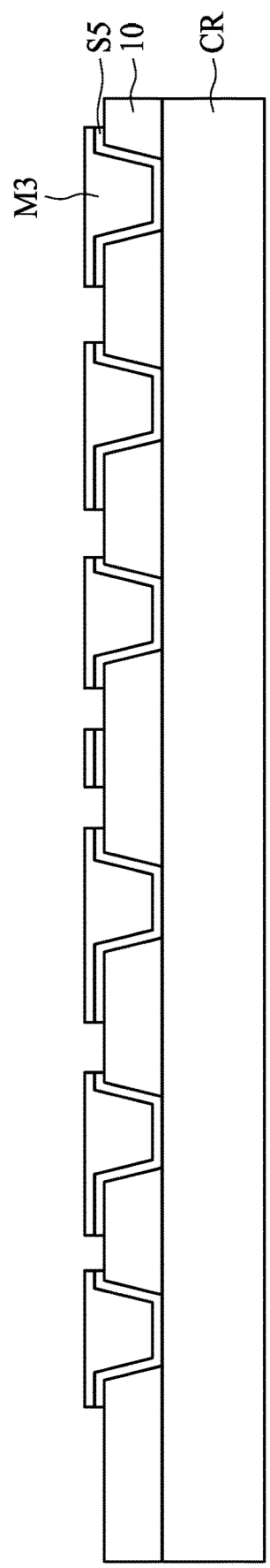

Referring to FIG. 11E, a portion of the PR layer P5 is removed to expose the metal layer M3, wherein an etching operation may be performed. Referring to FIG. 11F, the PR layer P5 and a portion of the metal layer M3 and a portion of the seed layer S5 that are exposed from the PR layer P5 in the structure of FIG. 11E are removed, wherein an etching operation may be performed.

Figure 11G:
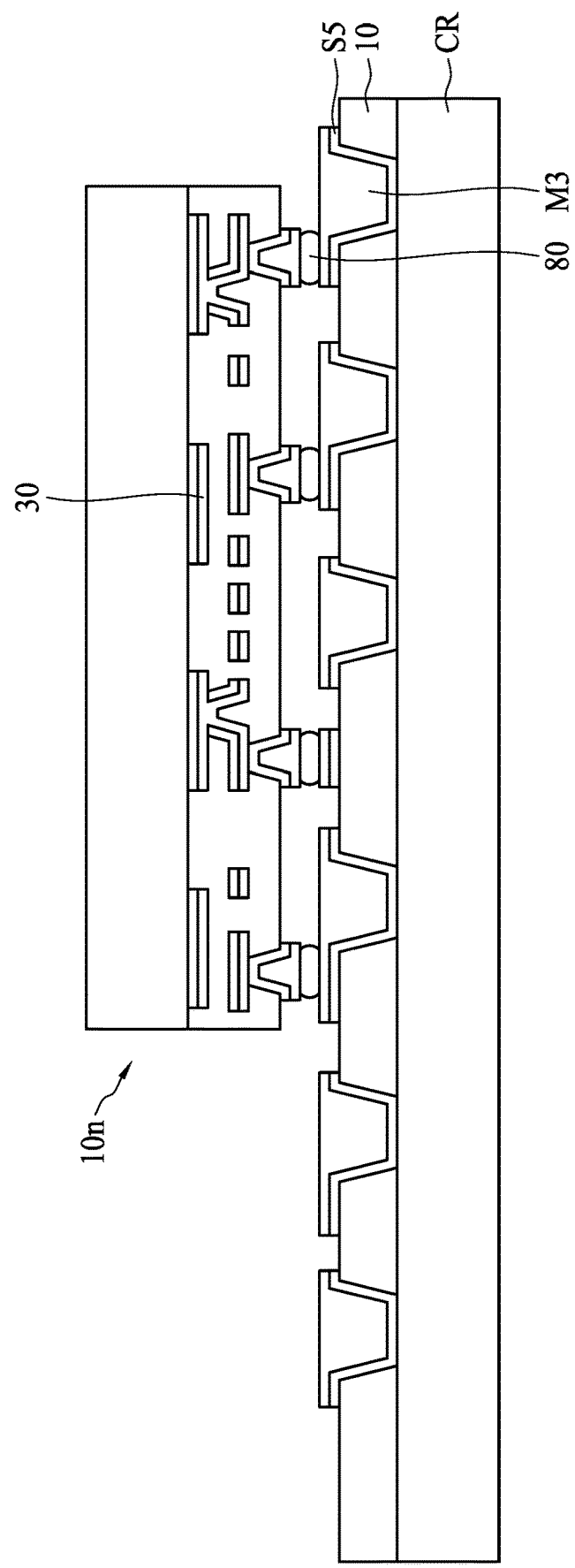
Figure 11H:
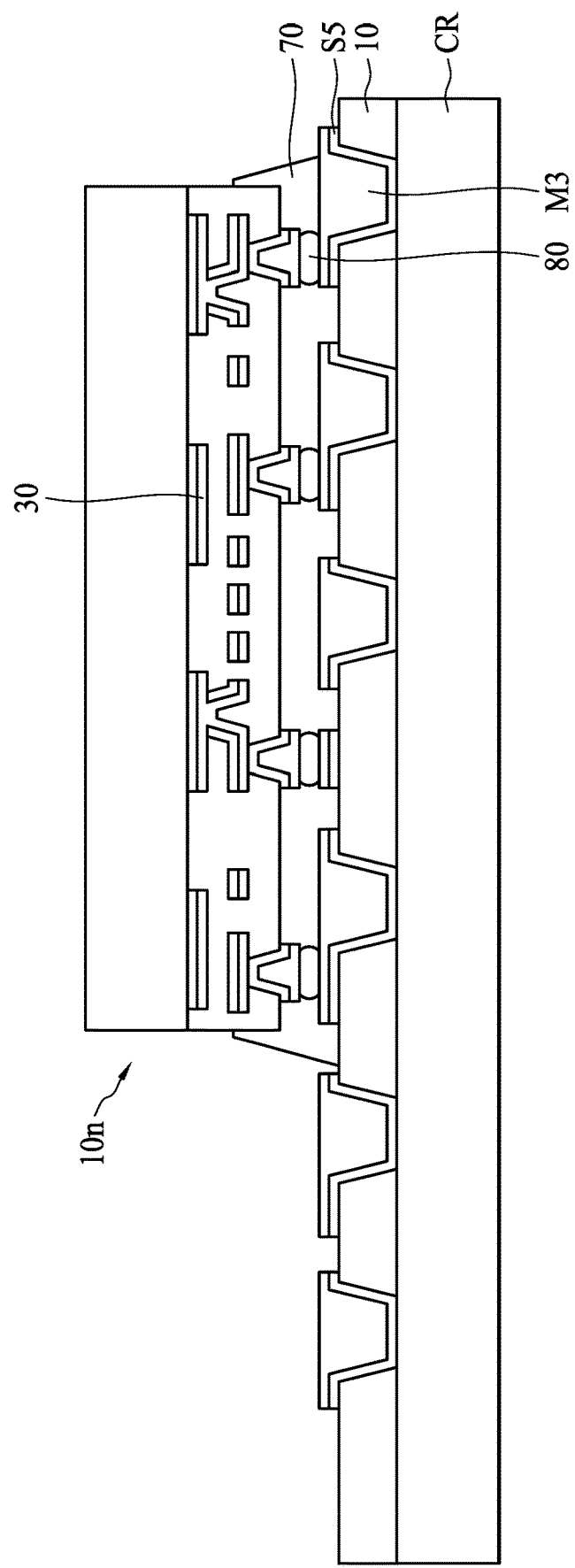

Referring to FIG. 11G, the interconnection layer 10n in FIG. 10N is bonded to the structure in FIG. 11F, with the connection elements 80 of the interconnection layer 10n bonded with the metal layer M3, wherein a thermal compressing bonding operation may be performed. Referring to FIG. 11H, an underfill 70 is disposed on the dielectric layer 10 to surround the connection elements 80 of the interconnection layer 10n, wherein a dispensing operation and a curing operation may be performed.

Figure 11I:
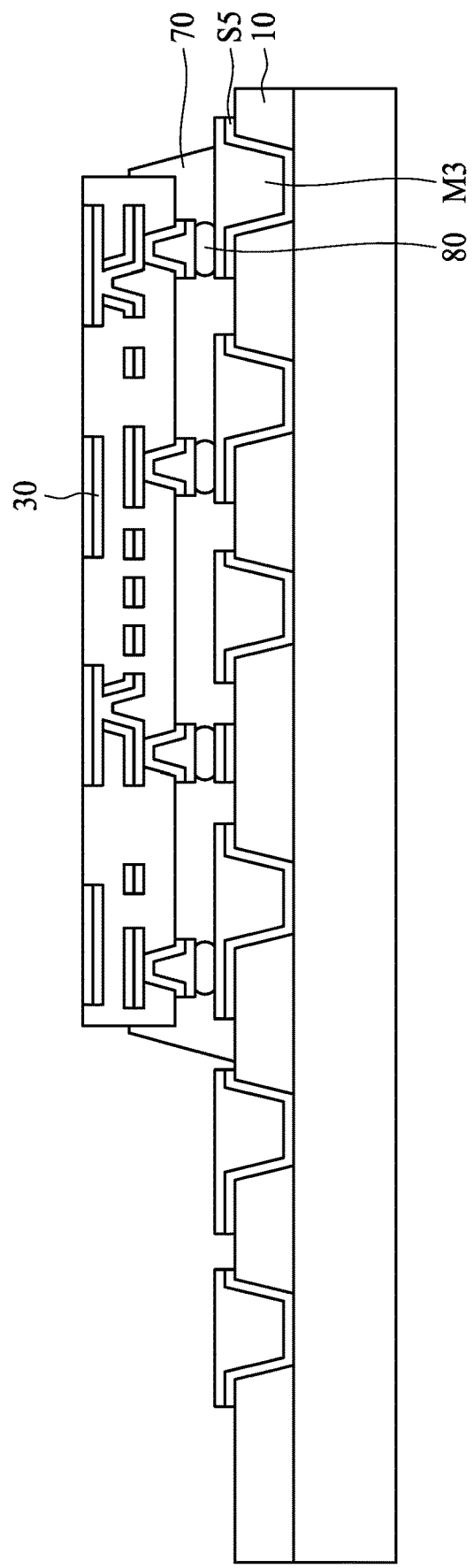
Figure 11J:
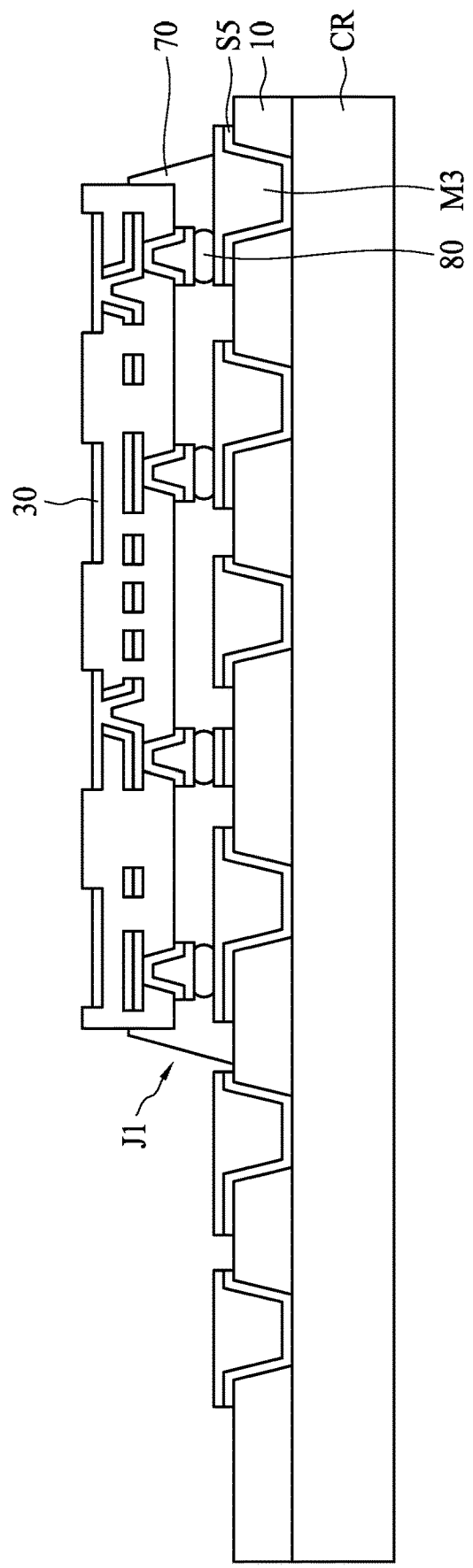

Referring to FIG. 11I, the carrier CR of the interconnection layer 10n is removed. Referring to FIG. 11J, the seed layer S2 of the interconnection layer 10n is removed to form an interconnection layer J1, wherein an etching operation may be performed. The interconnection layer J1 may be similar to the interconnection layer J1 of the semiconductor package 100 in FIG. 1A.

Figure 11K:
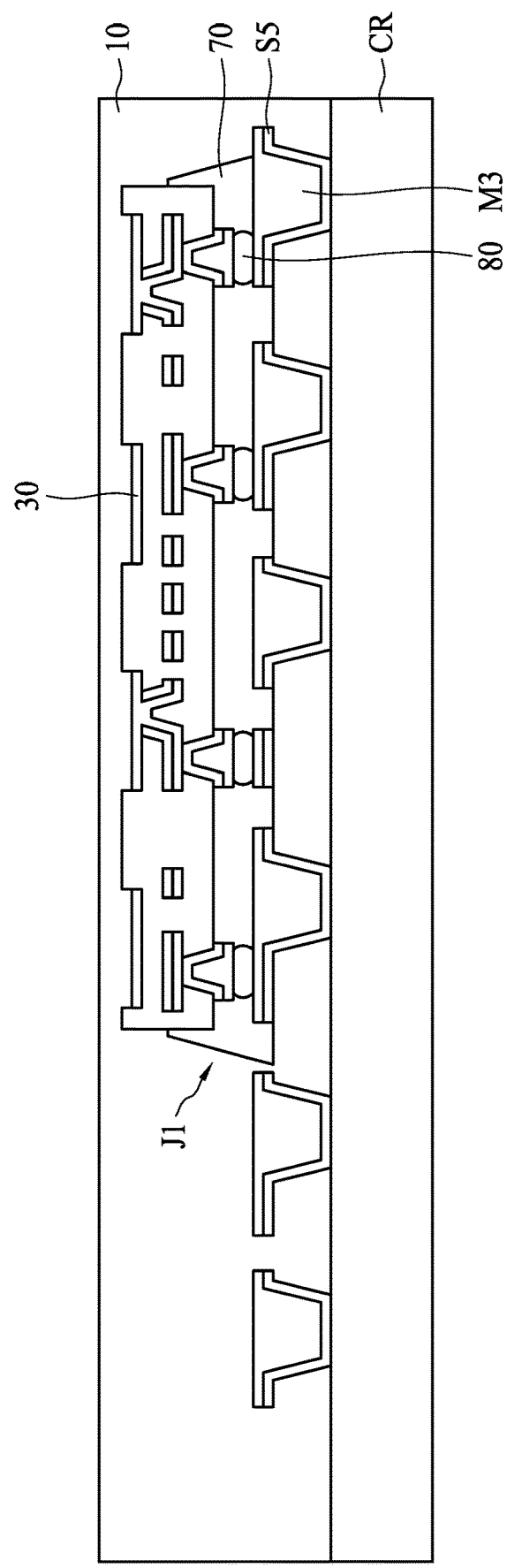
Figure 11L:
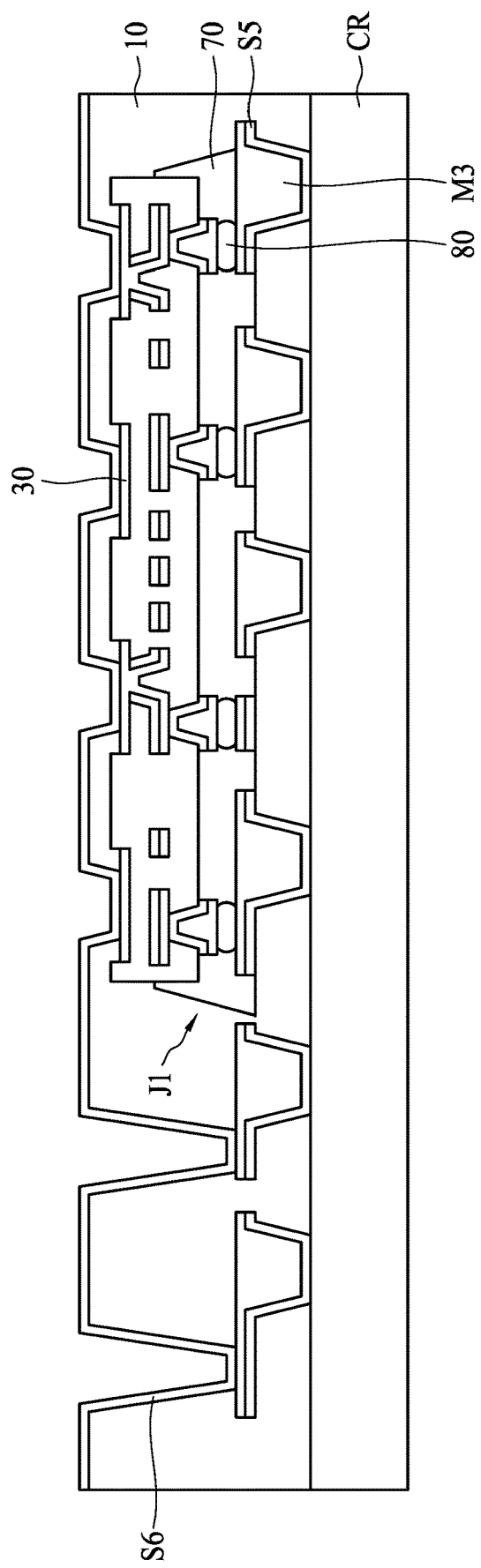

Referring to FIG. 11K, a dielectric layer 10 (or dielectric material) is formed on the structure in FIG. 11J to cover or encapsulate the interconnection layer J1, wherein a coating or lamination operation may be performed. Referring to FIG. 11L, a portion of the dielectric layer 10 is removed to expose the metal layer M3 and the metal layer 30 of the interconnection layer J1, wherein a laser drilling operation may be performed. A seed layer S6 is formed conformally on the dielectric layer 10.

Figure 11M:
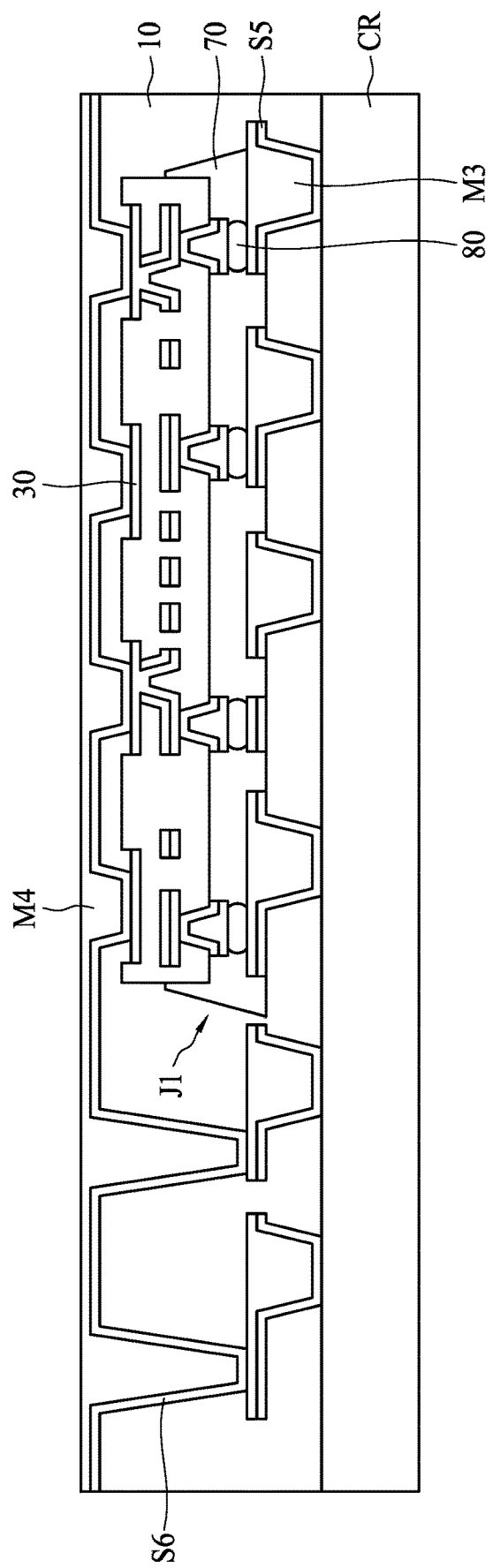
Figure 11N:
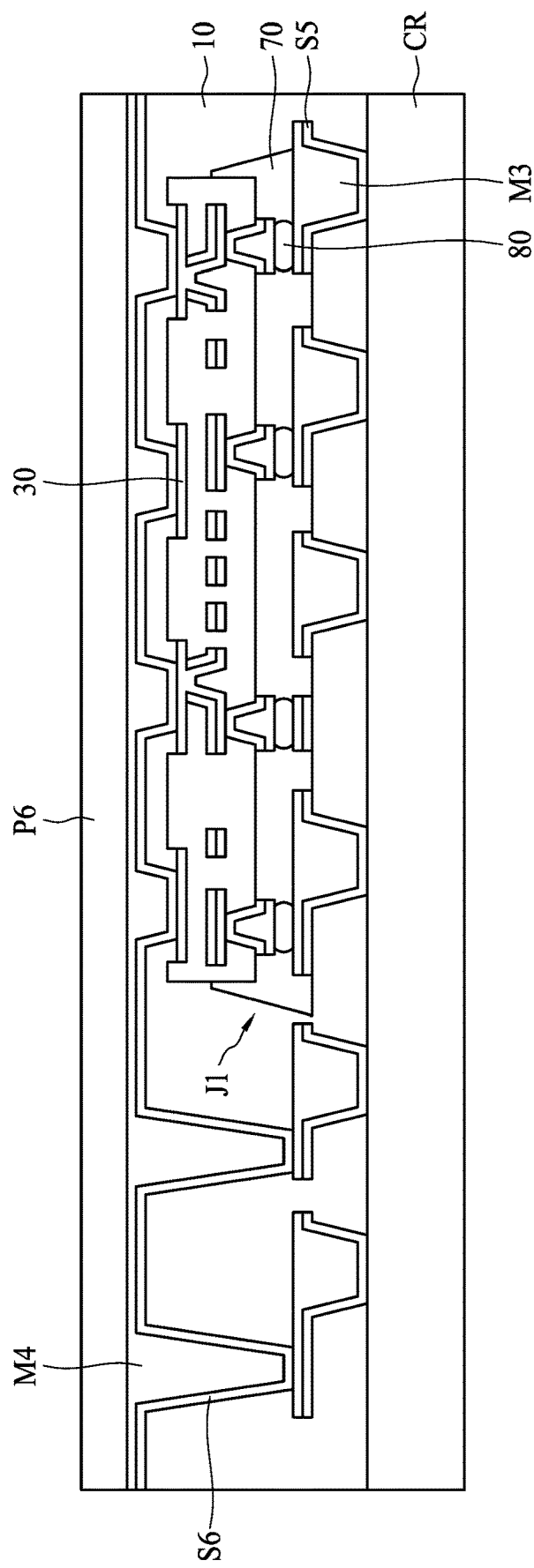
Figure 11O:
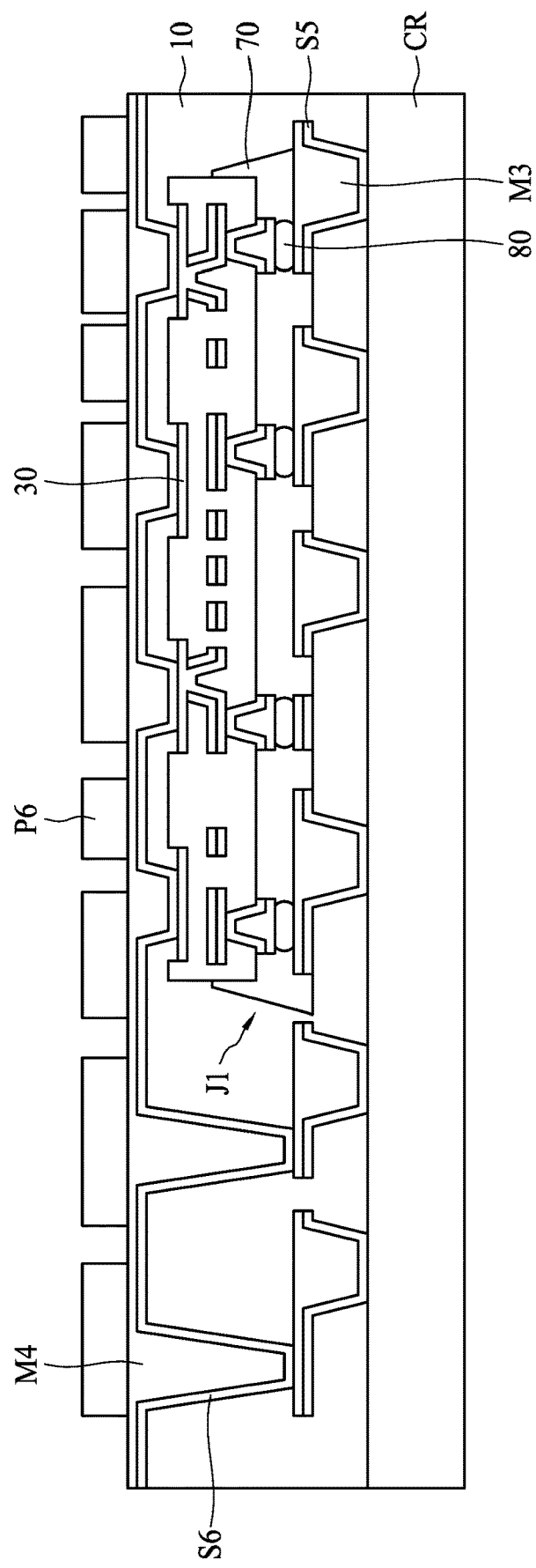

Referring to FIG. 11M, a metal layer M4 is formed on the seed layer S6, wherein a plating operation may be performed. Referring to FIG. 11N, a PR layer P6 is formed on the metal layer M4, wherein a coating or lithographic operation may be performed. An exposure operation may be performed. Referring to FIG. 11O, a portion of the PR layer P6 is removed to expose the metal layer M4, wherein an etching operation may be performed.

Figure 11P:
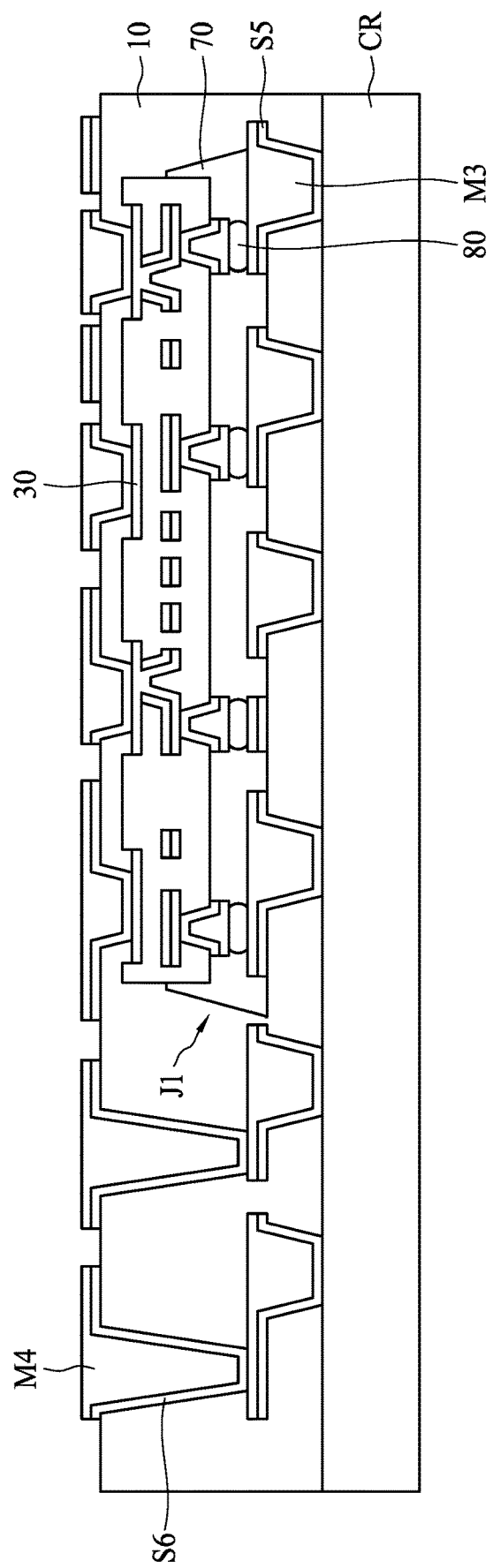
Figure 11Q:
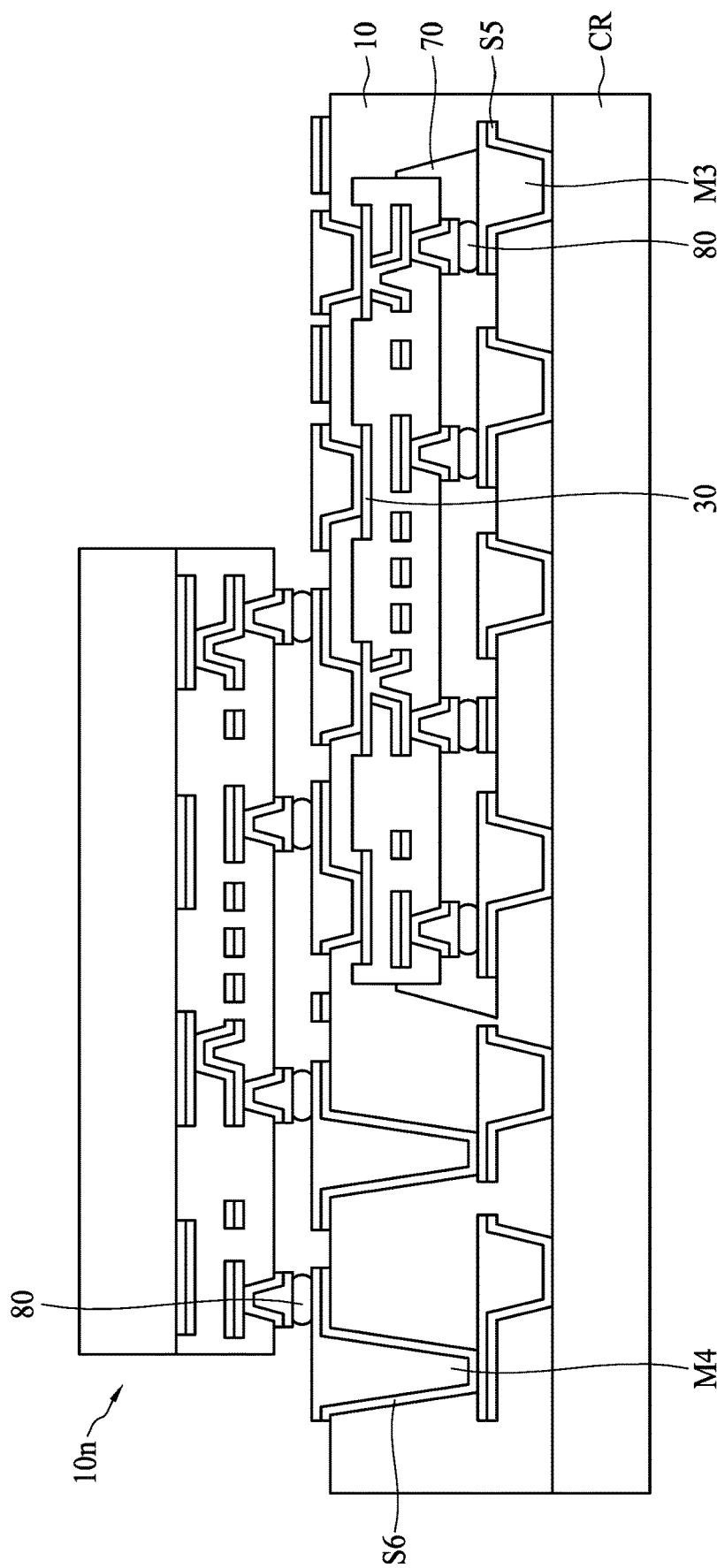

Referring to FIG. 11P, the PR layer P6 and a portion of the metal layer M4 and a portion of the seed layer S6 that are exposed from the metal layer M4 in FIG. 11O are removed, wherein an etching operation may be performed. Referring to FIG. 11Q, another interconnection layer 10n in FIG. 10N is bonded to the structure in FIG. 11P, with the connection elements 80 of the interconnection layer 10n bonded with the metal layer M4, wherein a thermal compressing bonding operation may be performed.

Figure 11R:
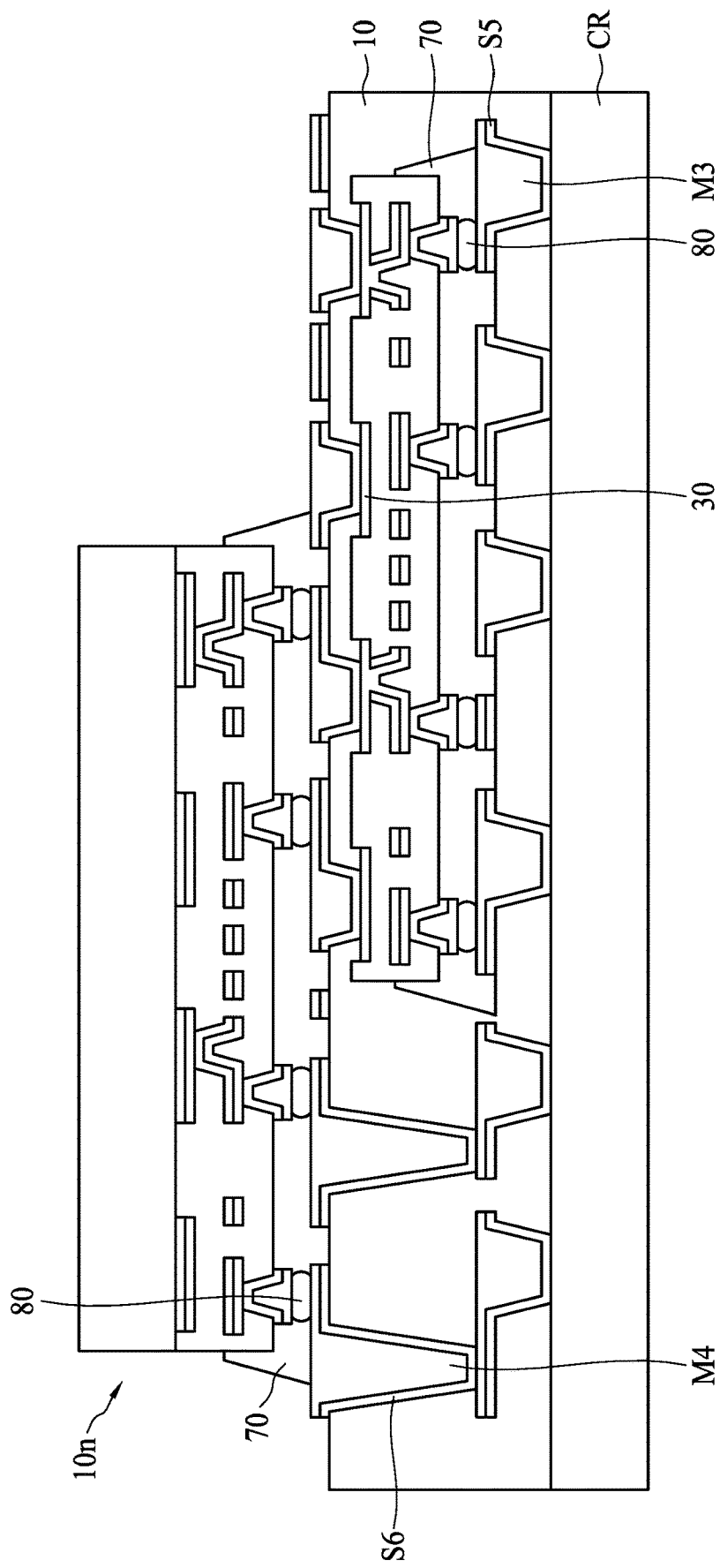
Figure 11S:
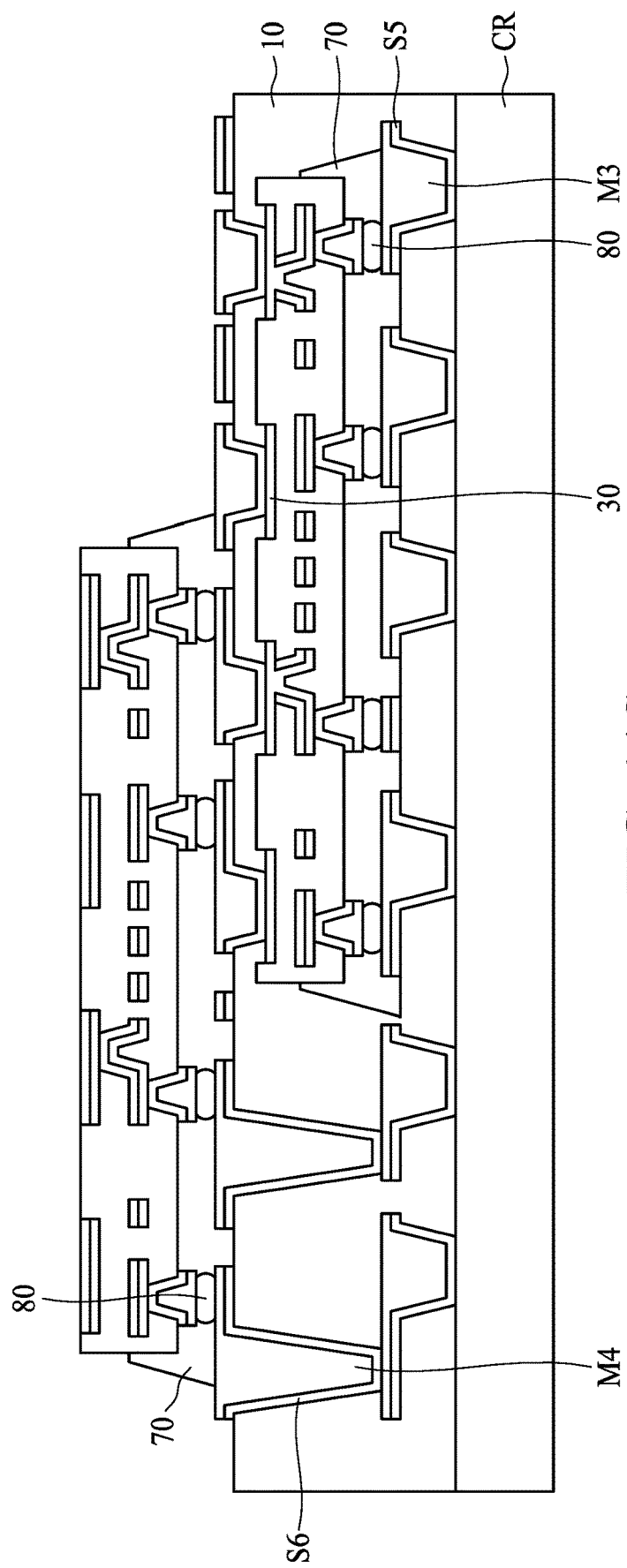
Figure 11T:
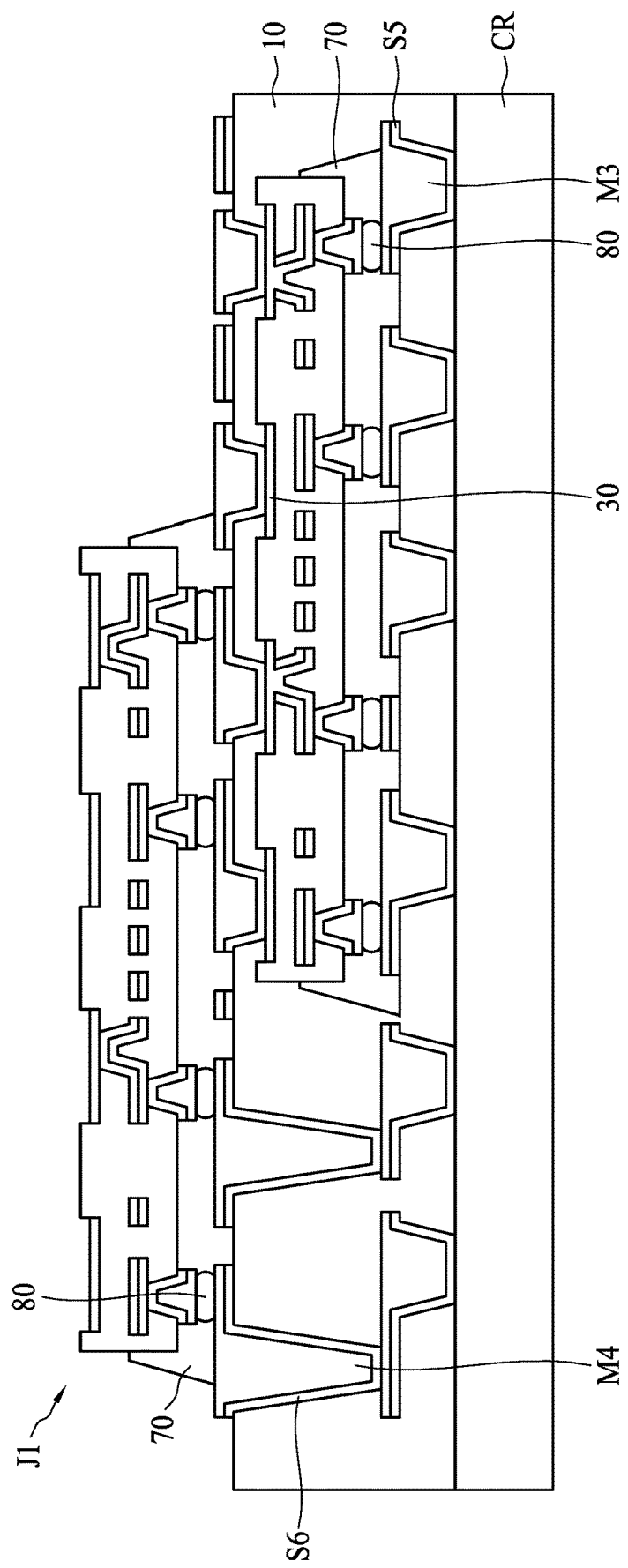

Referring to FIG. 11R, an underfill 70 is disposed on the dielectric layer 10 to surround the connection elements 80 of the interconnection layer 10n, wherein a dispensing operation and a curing operation may be performed. Referring to FIG. 11S, the carrier CR of the interconnection layer 10n is removed. Referring to FIG. 11T, the seed layer S2 of the interconnection layer 10n is removed to form an interconnection layer J1, wherein an etching operation may be performed. The interconnection layer J1 may be similar to the interconnection layer J1 of the semiconductor package 100 in FIG. 1A.

Figure 11U:
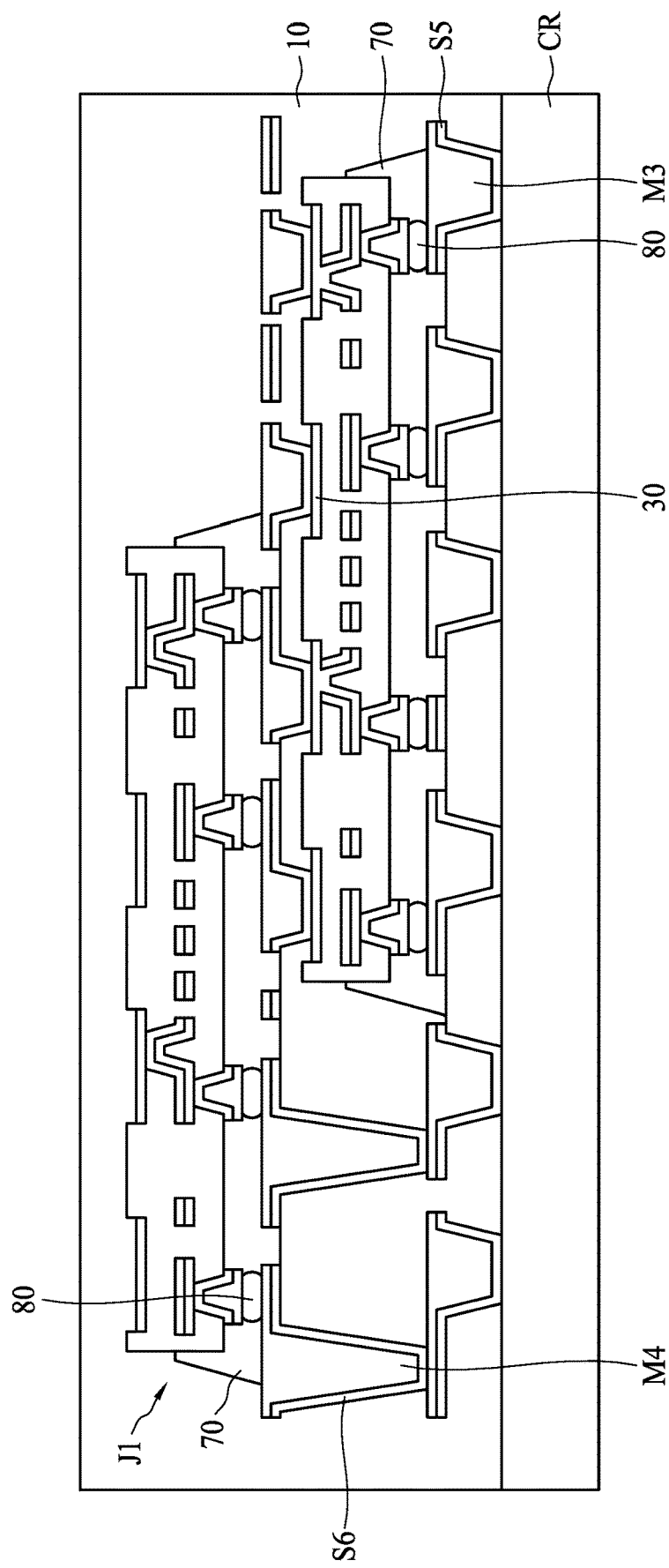
Figure 11V:
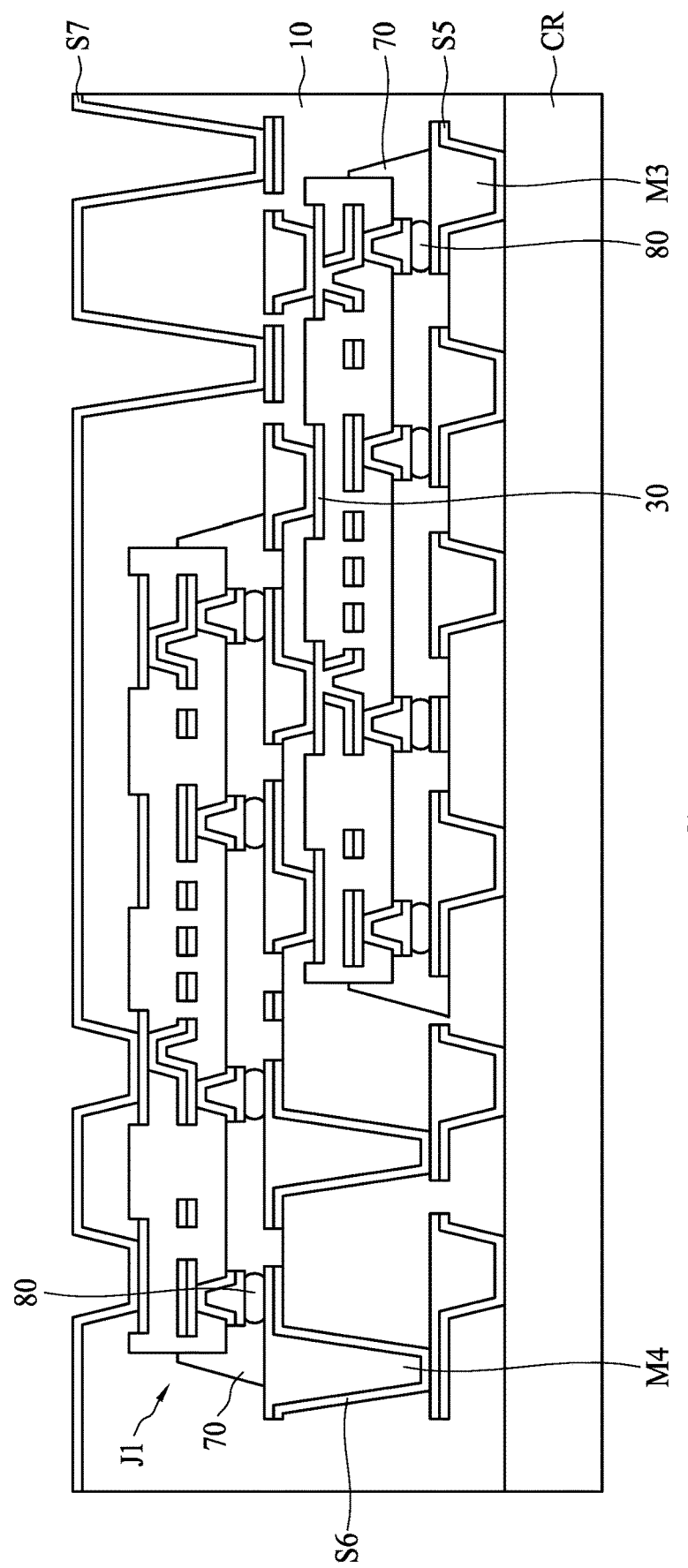

Referring to FIG. 11U, a dielectric layer 10 (or dielectric material) is formed on the structure in FIG. 11T to cover or encapsulate the interconnection layer J1, wherein a coating or lamination operation may be performed. Referring to FIG. 11V, a portion of the dielectric layer 10 is removed to expose the metal layer M4 and the metal layer 30 of the interconnection layer J1, wherein a laser drilling operation may be performed. A seed layer S7 is formed conformally on the dielectric layer 10.

Figure 11W:
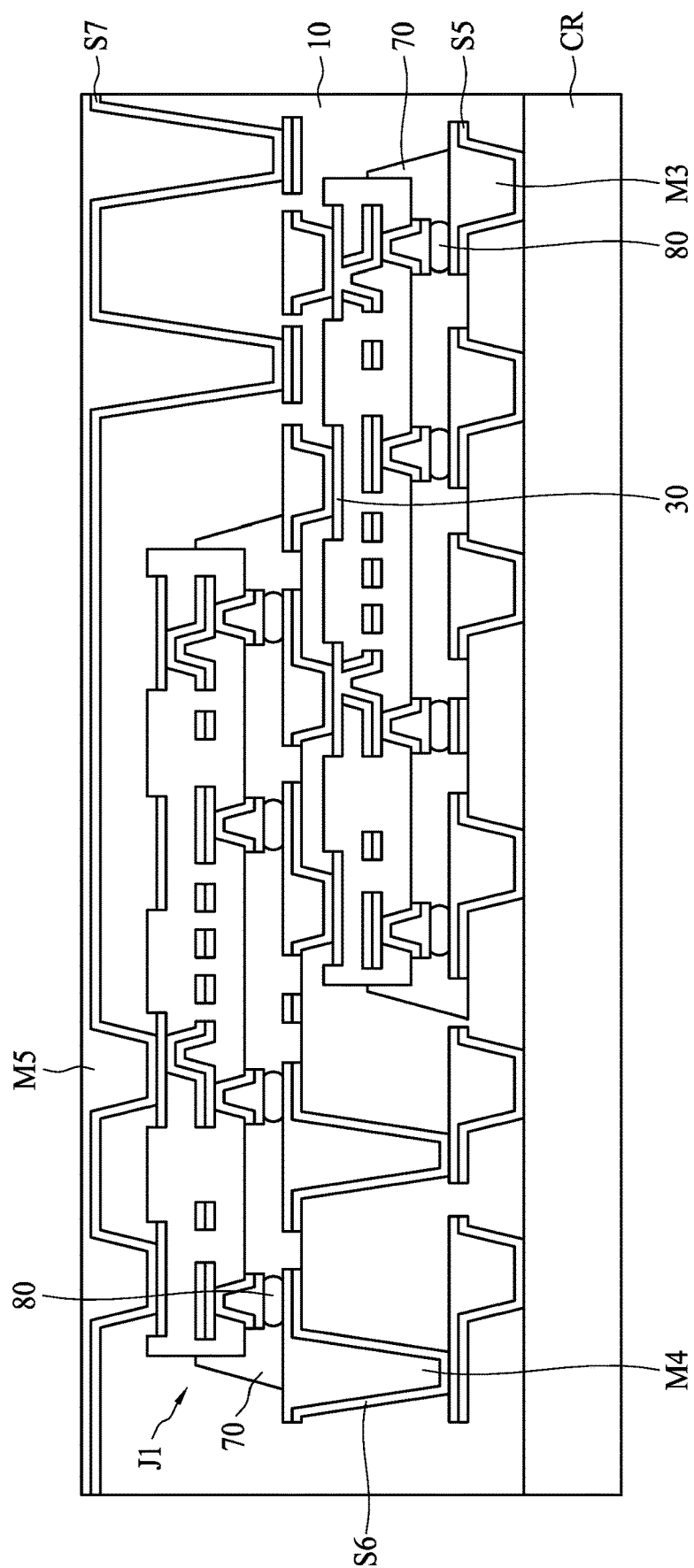
Figure 11X:
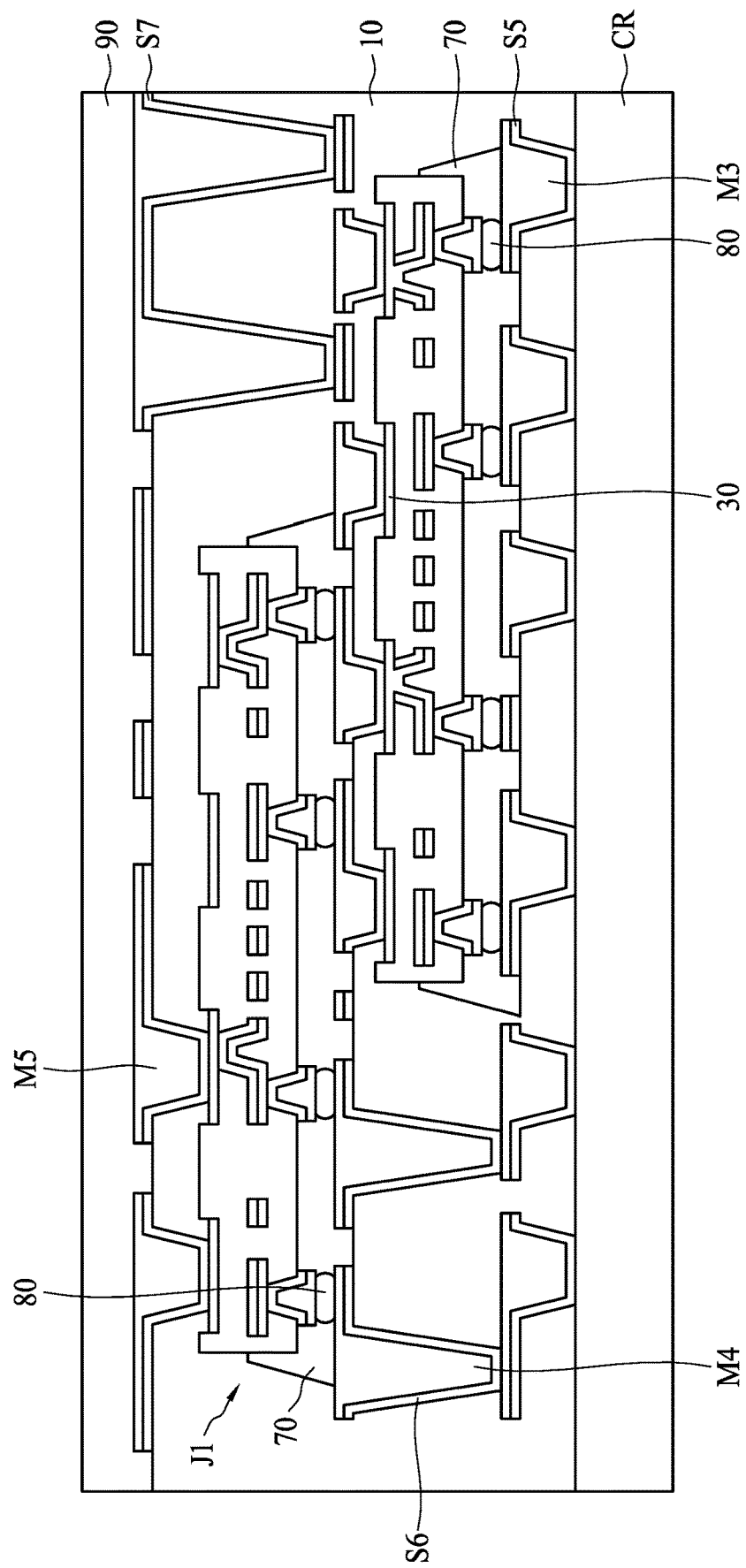

Referring to FIG. 11W, a metal layer M5 is formed on the seed layer S7, wherein a plating operation may be performed. Referring to FIG. 11X, a portion of the metal layer M5 is removed to expose the dielectric layer 10 and an insulation layer 90 is formed on the metal layer M5, wherein a coating or lithographic operation may be performed. The insulation layer 90 may include solder resist material.

Figure 11Y:
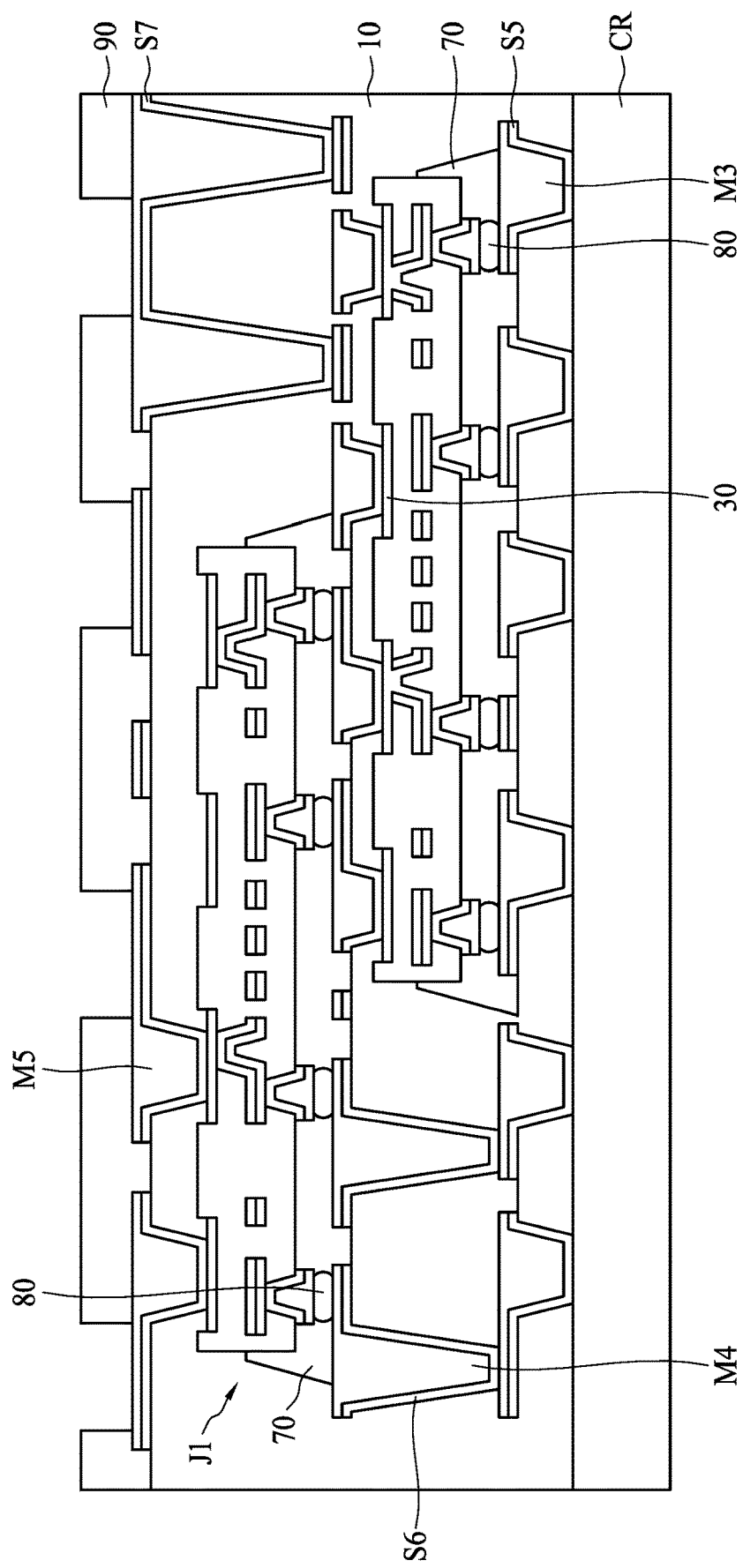
Figure 11Z:
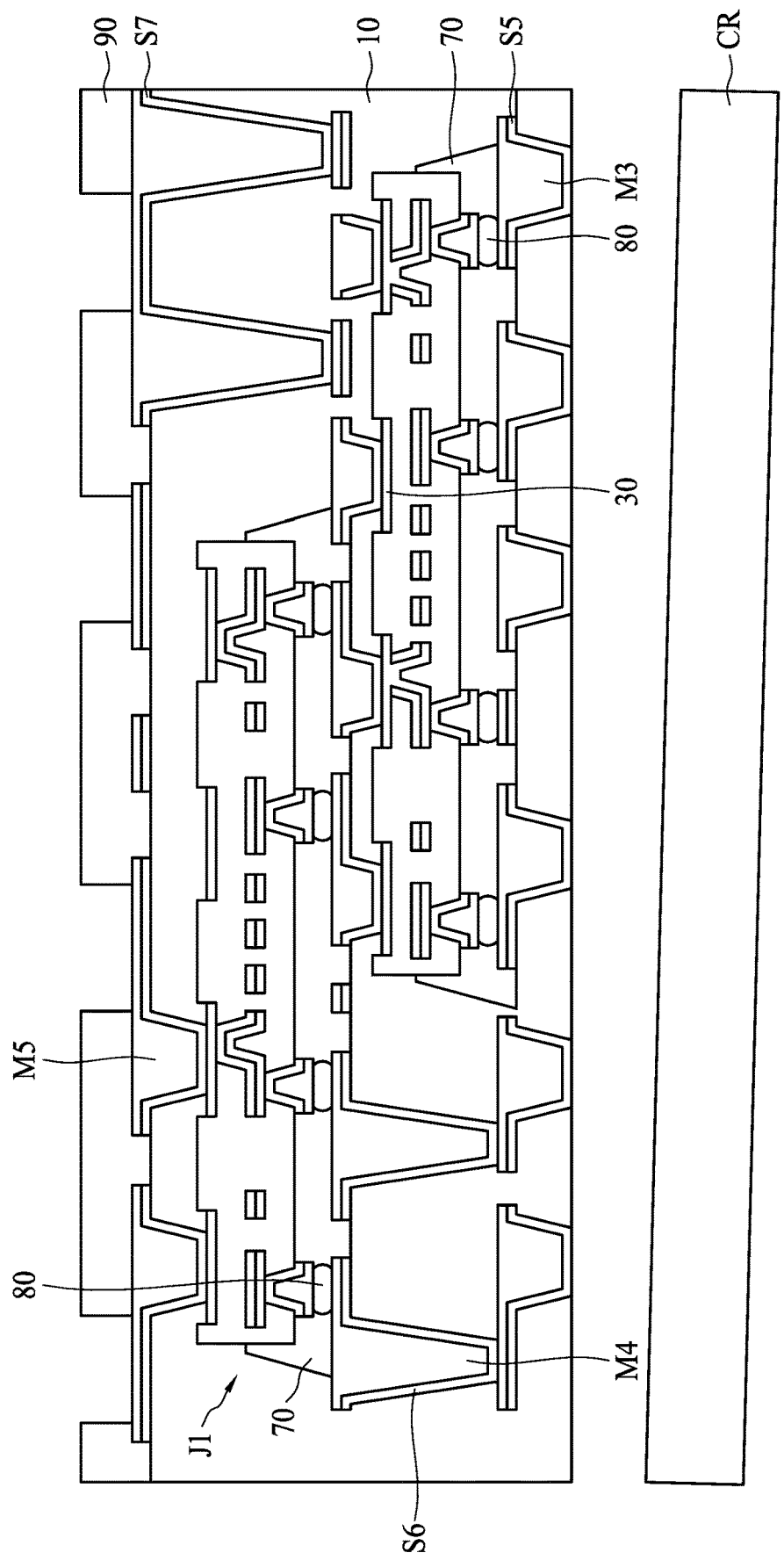
Figure 11A:
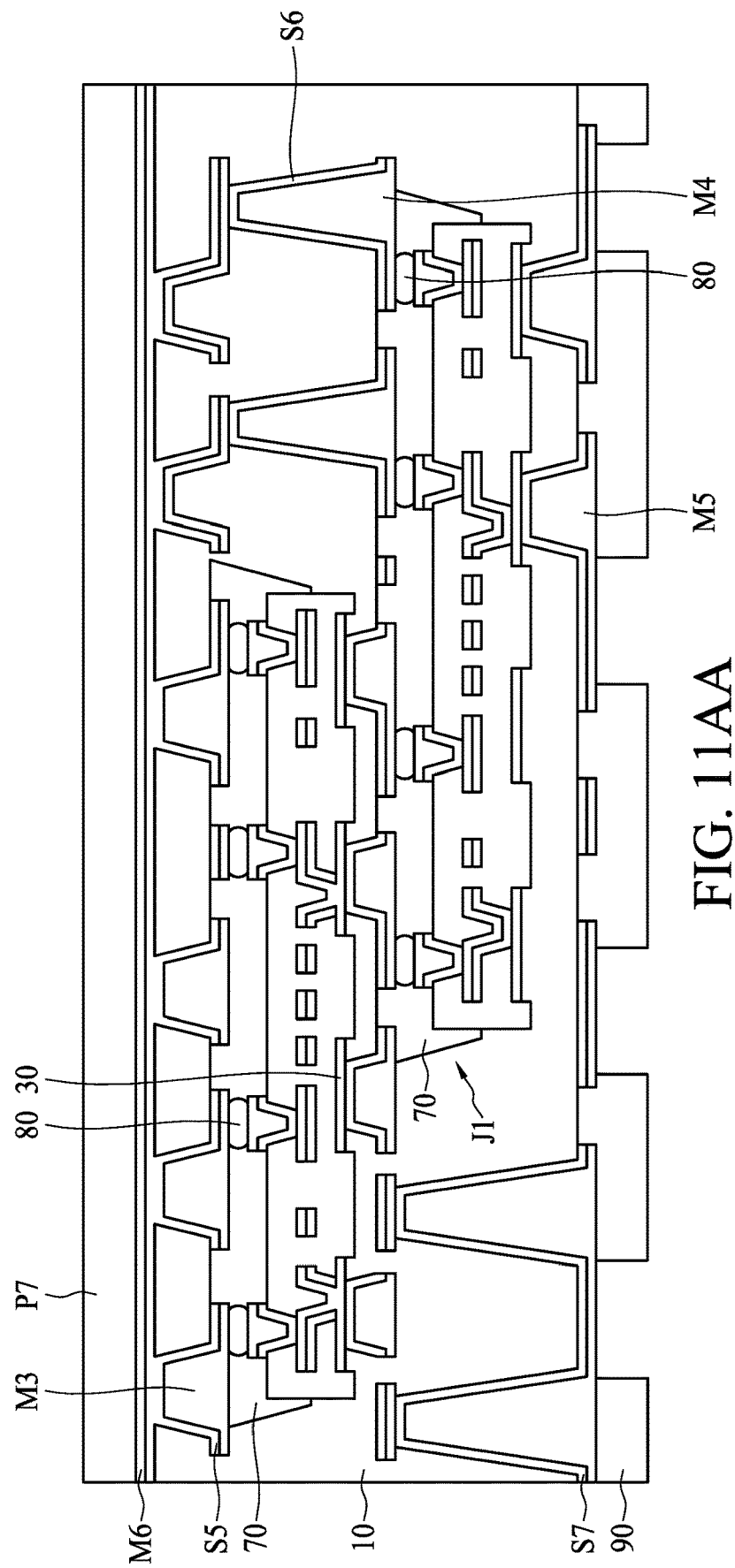
Figure 11A:
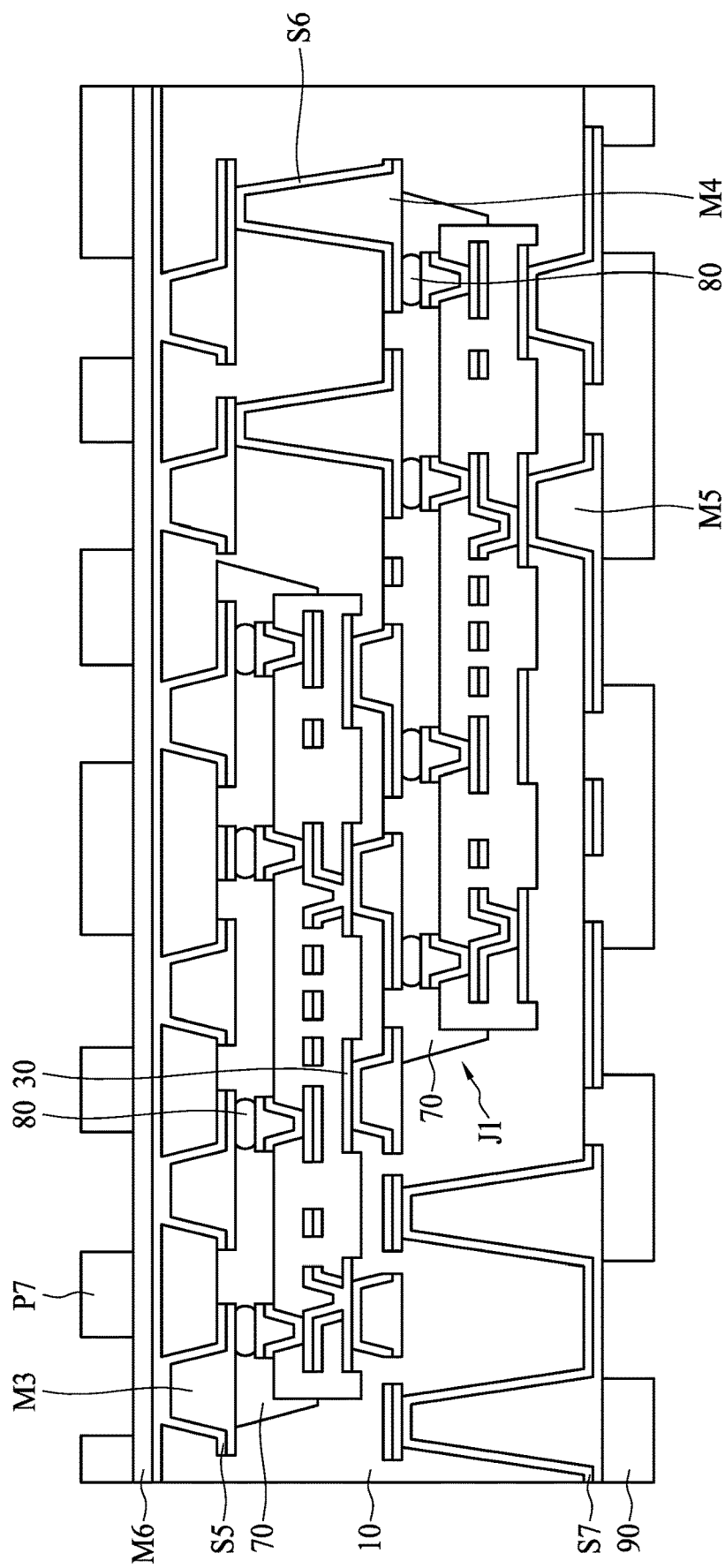
Figure 11A:
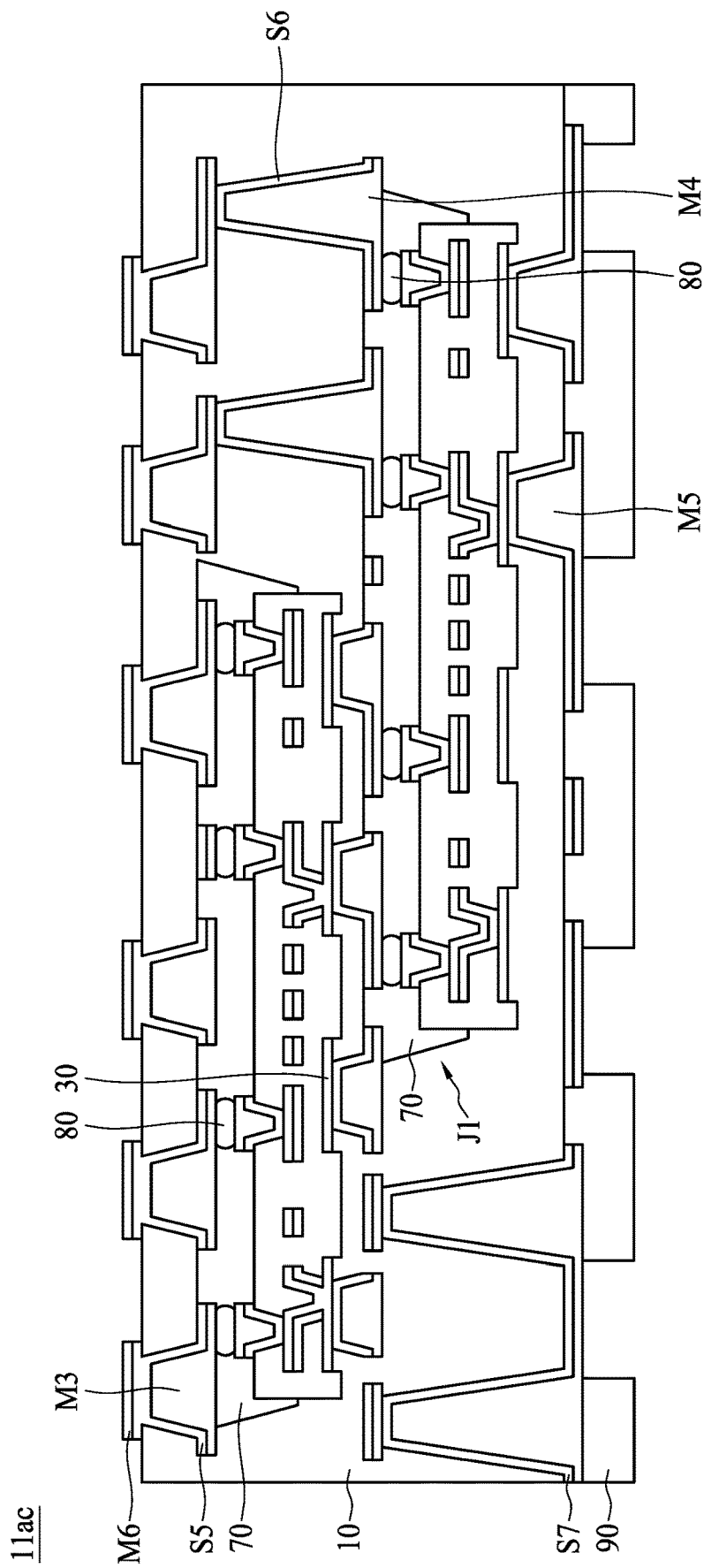

Referring to FIG. 11Y, a portion of the insulation layer 90 is removed to expose the metal layer M5, wherein an etching or developing operation may be performed. Referring to FIG. 11Z, the carrier CR is removed. Referring to FIG. 11AA, a metal layer M6 and a PR layer P7 are formed on the structure of FIG. 11Z, wherein a plating operation, a coating operation and a lithographic operation may be performed.

Referring to FIG. 11AB, a portion of the PR layer P7 is removed to expose the metal layer M6, wherein a developing operation or an etching operation may be performed. Referring to FIG. 11AC, the PR layer P7 and a portion of the metal layer M6 corresponding to the PR layer P7 are removed to form the semiconductor package 11ac, wherein an etching operation may be performed. The semiconductor package 11ac may be similar to the semiconductor package 100 in FIG. 1A.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a difference between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An interconnection structure, comprising:
   a first dielectric layer;
   a second dielectric layer disposed on the first dielectric layer, the second dielectric layer having a first surface and a second surface both facing toward the first dielectric layer, wherein the first surface of the second dielectric layer is recessed from the second surface of the second dielectric layer and defines a recess, and a portion of the first dielectric layer is disposed within the recess; and
   a metal layer disposed on the first surface of the second dielectric layer and within the recess,
   wherein the first dielectric layer has a first surface and a second surface, wherein the first surface faces toward the first surface of the second dielectric layer and in contact with the metal layer, the second surface faces toward the second surface of the second dielectric layer, and a distance between the second surface of the first dielectric layer and the first surface of the second dielectric layer is greater than a thickness of the metal layer.

2. The interconnection structure of claim 1, wherein the metal layer is recessed from the second surface of the second dielectric layer.

3. The interconnection structure of claim 1, wherein the first surface of the first dielectric layer protrudes from the second surface of the first dielectric layer.

4. The interconnection structure of claim 1, further comprising a conductive via in contact with the metal layer, wherein the conductive via is surrounded by the first dielectric layer.

5. The interconnection structure of claim 1, wherein a coefficient of thermal expansion (CTE) of the first dielectric layer is greater than a CTE of the second dielectric layer.

6. The interconnection structure of claim 1, wherein a modulus of the first dielectric layer is greater than a modulus of the second dielectric layer.

7. The interconnection structure of claim 1, wherein the first dielectric layer includes polypropylene and the second dielectric layer includes polyamide.

8. The interconnection structure of claim 1, wherein the second dielectric layer is embedded in the first dielectric layer.

9. The interconnection structure of claim 1, wherein a first interface defined between the metal layer and the first dielectric layer and a second interface defined between the first dielectric layer and the second dielectric layer are non-coplanar.

10. The interconnection structure of claim 1, wherein the metal layer completely covers the first surface of the second dielectric layer, or the metal layer has a side surface coplanar with a side surface of the second dielectric layer, and wherein the side surface and the first surface of the second dielectric layer define the recess.

11. A semiconductor package, comprising:
    a first interconnection layer having a first conductive layer and a first dielectric layer at least partially covering the first conductive layer, wherein the first dielectric layer has a recess and a first surface defined as a bottom of the recess;
    a second interconnection layer having a second conductive layer and a second dielectric layer at least partially covering the second conductive layer;
    a metal layer disposed on the first surface of the first dielectric layer and within the recess, wherein the metal layer has a first surface coplanar with the first surface of the first dielectric layer,
    wherein the first interconnection layer is at least partially surrounded by the second interconnection layer, a material of the first dielectric layer is different from a material of the second dielectric layer, and a pitch of the first conductive layer is less than a pitch of the second conductive layer.

12. The semiconductor package of claim 11, wherein a CTE of the second dielectric layer is greater than a CTE of the first dielectric layer.

13. The semiconductor package of claim 11, wherein a modulus of the second dielectric layer is greater than a modulus of the first dielectric layer.

14. The semiconductor package of claim 11, wherein the pitch of the first conductive layer is equal to or less than 7 µm.

15. The semiconductor package of claim 11, wherein the second dielectric layer includes polypropylene and the first dielectric layer includes polyamide.

16. The semiconductor package of claim 11, wherein an interface between the first interconnection layer and the second interconnection layer includes a first surface and a second surface, and the first surface and the second surface of the interface are discontinuous.

17. The semiconductor package of claim 16, wherein the first surface and the second surface of the interface are parallel to each other.

* * * * *